United States Patent [19]

Tanaka et al.

[11] Patent Number: 5,124,769
[45] Date of Patent: Jun. 23, 1992

[54] THIN FILM TRANSISTOR

[75] Inventors: Keiji Tanaka; Kenji Nakazawa; Shiro Suyama; Kinya Kato, all of Saitama, Japan

[73] Assignee: Nippon Telegraph and Telephone Corporation, Tokyo, Japan

[21] Appl. No.: 663,372

[22] Filed: Mar. 1, 1991

[30] Foreign Application Priority Data

Mar. 2, 1990 [JP] Japan ................................ 2-52409
Aug. 31, 1990 [JP] Japan ............................... 2-230209

[51] Int. Cl.$^5$ ................................................ H01L 29/78
[52] U.S. Cl. ................................ 357/23.14; 357/23.7
[58] Field of Search .......................... 357/23.14, 23.7

[56] References Cited

U.S. PATENT DOCUMENTS

| | | | |
|---|---|---|---|
| 4,065,781 | 12/1977 | Gutknecht | 357/23 |
| 4,984,040 | 1/1991 | Yap | 357/23.14 |
| 4,984,041 | 1/1991 | Hack et al. | 357/23.14 |
| 5,012,315 | 4/1991 | Shur | 357/23.14 |
| 5,017,983 | 5/1991 | Wu | 357/23.14 |

FOREIGN PATENT DOCUMENTS

| | | |
|---|---|---|
| 0066675 | 12/1982 | European Pat. Off. |
| 0166261 | 1/1986 | European Pat. Off. |
| 1514362 | 7/1965 | Fed. Rep. of Germany |
| 1505959 | 12/1967 | France |

OTHER PUBLICATIONS

Proceedings of the IEEE, vol. 55, No. 7, Jul. 1967, N.Y., US, pp. 1217-1218; R. G. Wagner et al., "A Dual Offset Gate Thin-Film Transistor", p. 1218, col. 1, paragraph 2; FIGS. 1, 3b.
Patent Abstracts of Japan, vol. 7, No. 214 (E-199)(1359) Sep. 21, 1983, & JP-A-58 107676 (Nippon Denki K.K.) Jun. 27, 1983.
Patent Abstracts of Japan, vol. 6, No. 218 (E-139)(1096) Nov. 2, 1982, & JP-A-57 121277 (Hitachi Seisakusho K.K.) Jul. 28, 1982.
International Journal of Electronics, vol. 54, No. 2, Feb. 1983, London GB, pp. 287-298; K. V. Anand et al., "A Novel p-n Junction Polycrystalline Silicon Gate MOSFET".
Patent Abstracts of Japan, vol. 10, No. 263 (E-435)(2319) Sep. 9, 1986, & JP-A-61 88565 (Sony Corp.), May 6, 1986.

*Primary Examiner*—James W. Davie
*Attorney, Agent, or Firm*—Oblon, Spivak, McClelland, Maier & Neustadt

[57] ABSTRACT

The thin film transistor comprises source and drain regions, a channel forming region formed between the source and drain regions, a first (main) gate for turning on or off the transistor, and in particular at least one second (sub-) gate for reducing turn-off leakage current. When the n-channel transistor is turned off, for example, a negative voltage is applied to the main gate to form a p-channel layer in the channel forming region under the main gate and a positive voltage is applied to the subgate to form an n-channel layer in the channel forming region under the subgate, for instance, so that a pn junction can be formed between under the main gate and the subgate to reduce the turn-off leakage current. The above-mentioned disclosure can be clearly applied to p-channel transistors. Further, the above four-terminal transistor can be simply modified to a three-terminal transistor by connecting the main gate to the subgate via a diode or a capacitor or by directly connecting the drain region to the subgate. Further, the above three-terminal transistor can be manufactured in accordance with only the ordinary device manufacturing process.

24 Claims, 32 Drawing Sheets

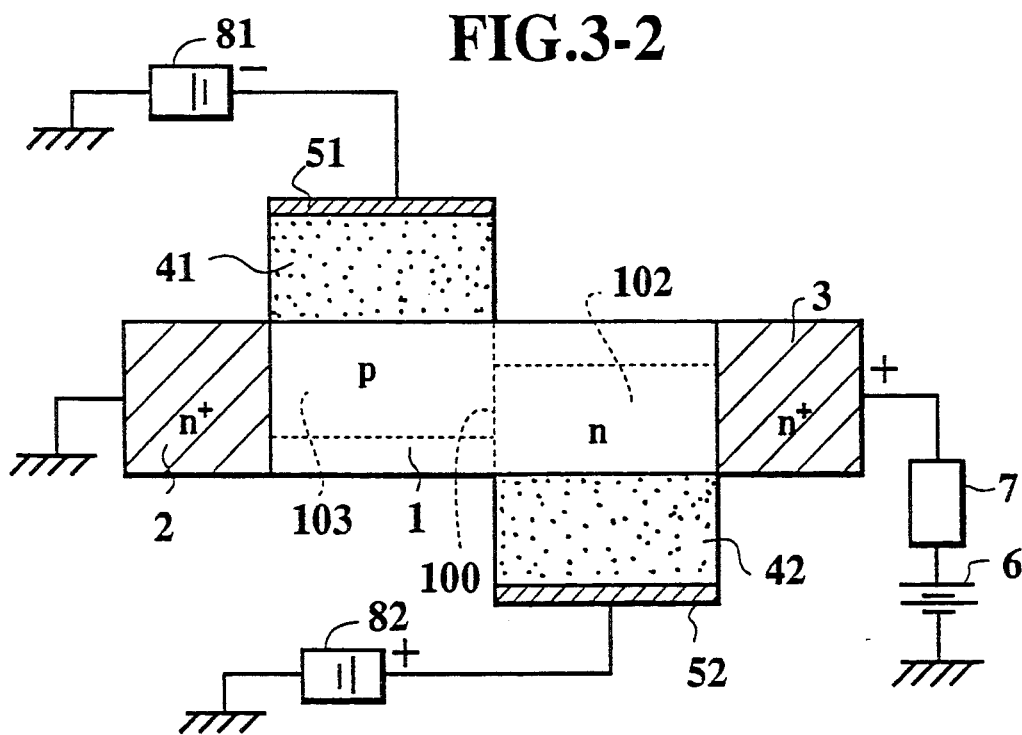

THIN FILM TRANSISTOR

BACKGROUND OF THE INVENTION

1. Field of the Invention

The present invention relates to a thin film transistor suitable for use as a switching element, and more specifically to a thin film transistor of a small off current or of a high on/off current ratio.

2. Description of the Prior Art

A prior-art thin film transistor is well known as shown in FIG. 1A, in which only the basic transistor structure is diagrammatically depicted. In the drawing, the transistor includes a channel forming region 1, source and drain regions 2 and 3, a gate insulating film 4, and a gate electrode 5.

The channel forming region 1 is a semiconductor thin film formed of polysilicon or amorphous silicon, for instance having neither n-type nor p-type impurity doped intentionally or having a sufficiently low n-type or p-type impurity concentration. The source and drain regions 2 and 3 are a semiconductor thin film formed of polysilicon or amorphous silicon, for instance having a sufficiently high n-type or p-type impurity concentration, respectively as compared with that of the channel forming region, and arranged at first and second different positions adjoining to the channel forming region 1, respectively. Further, the gate electrode 5 is formed over a principal plane 1a of the channel forming region 1 and between the source region 2 and the drain region 3, via the gate insulating film 4 formed of silicon oxide, for instance.

In the prior-art thin film transistor constructed as described above, when a positive control voltage is applied by a control voltage supply 8 to the gate electrode 5 with the source region 2 as zero voltage level, as shown in FIG. 1A-1, under the condition that a positive voltage is applied to the drain region 3 by another voltage supply 6 via a load 7, since an n-type channel layer 10 is formed within the channel forming region 1 and under the gate electrode 5 so as to expand from the gate insulating film 4 in the direction opposite to the gate electrode 5 and extend between the source and drain regions 2 and 3, the range between the source and drain regions 2 and 3 is turned on, so that current is supplied from the voltage supply 6 to the load 7.

Under these conditions, when a negative control voltage is applied by the control voltage supply 8 to the gate electrode 5 with the source region 2 as zero voltage level, as shown in FIG. 1A-2, since a p-type channel layer 11 is formed within the channel forming region 1 and under the gate electrode 5 so as to expand from the gate insulating film 4 in the direction opposite to the gate electrode 5 and extend between the source and drain regions 2 and 3, a backward pn junction 12 is formed between the n-type drain region 3 and the p-type channel layer 11, so that the range between the source and drain regions 2 and 3 is turned off and therefore current is not supplied from the voltage supply 6 to the load 7.

Accordingly, the prior-art thin film transistor shown in FIG. 1A can be preferably used as a switching element.

Further, another prior-art thin film transistor has been proposed by the same applicant as shown in FIG. 1B. In the drawing, this prior-art thin film transistor shown in FIG. 1B is basically the same in structure as the previous prior-art transistor shown in FIG. 1A except that an offset region 20 of a semiconductor thin film formed of polysilicon or amorphous silicon, for instance having an n-type impurity concentration lower than that of the drain region 3 is interposed between the channel forming region 1 and the drain region 3. Therefore, the same reference numerals have been retained for similar elements which have the same functions, without repeating any detailed description of them.

In this prior-art thin film transistor constructed as described above, when a positive control voltage is applied by a control voltage supply 8 to the gate electrode 5 with the source region 2 as zero voltage level, as shown in FIG. 1B-1, under the condition that a positive voltage is applied to the drain region 3 by a voltage supply 6 via a load 7, since an n-type channel layer 10 is formed within the channel forming region 1 and under the gate electrode 5 so as to expand from the gate insulating film 4 in the direction opposite to the gate electrode 5 and extend between the source region 2 and the offset region 20 in the same way as with the case of the prior-art transistor shown in FIG. 1A, a range between the source region 2 and the drain region 3 is turned on via the offset region 20, so that current is supplied from the voltage supply 6 to the load 7.

Further, under these conditions, when a negative control voltage is applied by the control voltage supply 8 to the gate electrode 5 with the source region 2 as zero voltage level, as shown in FIG. 1B-2, since a p-type channel layer 11 is formed within the channel forming region 1 and under the gate electrode 5 so as to expand from the gate insulating film 4 in the direction opposite to the gate electrode 5 and extend between the source region 2 and the offset region 20 in the same way as with the case of the prior-art transistor shown in FIG. 1A, a backward pn junction 13 is formed between the n-type offset region 20 and the p-type channel layer 11, so that the range between the source and drain regions 2 and 3 is turned off and therefore current is not supplied from the voltage supply to the load 7.

Accordingly, the prior-art thin film transistor shown in FIG. 1B can be preferably used as a switching element in the same way as with the case of the prior-art transistor shown in FIG. 1A.

In the case of the prior-art thin film transistor shown in FIG. 1A, as already explained, the p-type channel layer 11 is formed within the channel forming region 1 when the transistor is turned from on (as shown in FIG. 1A-1) to off (as shown in FIG. 1A-2). In this turn-off state, however, a depletion layer is formed at the pn junction 12 between the n-type drain region 3 and the p-type channel layer 11 in such a way as to extend toward both the drain region 3 and the channel layer 11, respectively. In this case, since the drain region 3 is formed of a semiconductor having a relatively high n-type impurity atom concentration, the width of the depletion layer extending toward the drain region is relatively narrow. That is, since the depletion layer existing at this pn junction 12 is relatively narrow in width, when the transistor is kept turned off, a relatively high electric field is generated at the depletion layer of the pn junction 12 between the drain region 3 and the channel layer 11, so that there exists a problem in that a relatively large leakage current flows from the drain region 3 to the source region 2 through traps existing at the depletion layer extending between the drain region 3 and the channel layer 11 in the transistor turn-off state.

In the case of the prior-art thin film transistor shown in FIG. 1B, as already explained, a p-type channel layer 11 is formed within the channel forming region 1 when the transistor is turned from on (as shown in FIG. 1B-1) to off (as shown in FIG. 1B-2). In this state, in the same way as in the transistor as shown in FIG. 1A, a depletion layer is formed at the pn junction 13 between the n-type offset region 20 and the p-type channel layer 11 in such a way as to extend toward both the offset region 20 and the channel layer 11, respectively. In this transistor, since the offset region 20 is formed of semiconductor having a relatively low n-type impurity concentration, the width of the depletion layer extending toward the offset region 20 is relatively wide. That is, since the depletion layer existing at the pn junction 13 is relatively wide in width, when the transistor is kept turned off, a relatively low electric field is generated at the depletion layer at the pn junction 13 between the offset region 20 and the channel layer 11, so that a relatively low leakage current flows from the drain region 3 to the source region 2 through defects existing (if any) at both the depletion layers extending toward the offset range 3 and the channel layer 11 in the transistor turn-off state. That is, in the transistor shown in FIG. 1B, it is possible to markedly reduce the leakage current flowing from the drain region 3 to the source region 2 when the transistor is kept turned off.

In the case of the prior-art thin film transistor shown in FIG. 1B, however, when the offset region 20 is formed to such a low concentration that the off current can be sufficiently suppressed, since the resistance of this region 20 becomes higher than that of the channel 10 or the drain region 3 formed in the active region 1, there exists a problem in that the on current is extremely reduced, since an offset region 20 must be formed between the channel forming region 1 and the drain region 3 by a semiconductor thin film having an n-type relatively low impurity concentration as compared with that of the drain region 3, there exists a problem in that the manufacturing process is complicated to form the offset region 20 and therefore the manufacturing cost is high.

SUMMARY OF THE INVENTION

With these problems is mind, therefore, it is the primary object of the present invention is to provide a novel thin film transistor which can increase the on current and decrease the off current flowing between the drain region and the source region, that is, can improve the on/off current ratio of the thin film transistor.

To achieve the above-mentioned object, the thin film transistor according to the present invention comprises: (a) a source region (2) formed of a first conductive type semiconductor film; (b) a drain region (3) formed of the first conductive type semiconductor film; (c) a channel forming region (1) formed of a semiconductor thin film having a low impurity concentration between said source and drain regions; (d) a first gate (51) formed over a first principal plane (1a) of said channel forming region via a first gate insulating film (41), for turning on or off the thin film transistor; and (e) a second gate (52) formed over said channel forming region via a second gate insulating film (42), for reducing current flowing between said source and drain regions when the transistor is turned off.

In the first aspect of the present invention, first and second voltages are applied to said first and second gates (51, 52) to form first conductive type channel layers (101, 102) in said channel forming region under said first and second gate insulating films (41, 42) when the transistor is turned on, but a third voltage opposite to the first voltage is applied to the first gate (51) to form a second conductive type channel layer (103) in said channel forming region under said first gate insulating film (41) and the second voltage is applied to the second gate (52) to form the first conductive type channel layer (102) in said channel forming region under said second gate insulating film (42) when the transistor turned off, so that a pn junction (100) is formed in said channel forming region (1) under between said first and second gate insulating films (41, 42) to reduce off current flowing between said source and drain regions.

In the second aspect of the present invention, first and second voltages are applied to said first and second gates (51, 52) to form a first conductive type channel layers (101, 102) in said channel forming region under said first and second gate insulating films (41, 42) when the transistor is turned on, but a third voltage opposite to the first voltage is applied to the first and second gates to form a second conductive type channel layer (103) in said channel forming region under said second gate insulating film (42) and the same second conductive type channel layer (104) having a carrier concentration lower than that (103) under said first gate insulating film (41) in said channel forming region under said second gate insulating film (42) when the transistor is turned off, so that a wide depletion layer (110) is formed between said source or drain region (2, 3) and the second conductive type semiconductor layer (104) to reduce off current flowing between said source and drain regions.

Further, in the first embodiment of the present invention, said first gate (51) and said second gate (52) are formed on a first principal plane (1a) of said channel forming region. In the second embodiment of the present invention, said first gate (51) is formed on a first principal plane (1a) of said channel forming region and said second gate (52) is formed on a second principal plane (1b) opposite to the first principal plane of said channel forming region. In the third embodiment of the present invention, the transistor further comprises a third gate (53) formed over said channel forming region via a third gate insulating film (53) so as to sandwich the first gate between said second and third gates, and further said first gate (51) and said second and third gates (52, 53) are all formed on a first principal plane (1a) of said channel forming region. In the fourth embodiment of the present invention, the transistor further comprises a third gate (53) formed over said channel forming region via a third gate insulating film (43) so as to sandwich the first gate between said second and third gates, and further said first gate (51) is formed on a first principal plane (1a) of said channel forming region and said second and third gates (52, 53) are formed on a second principal plane (1b) opposite to the first principal plane of said channel forming region.

Further to modify the four-terminal transistor to a three-terminal transistor, in the case of the first and second embodiments, a diode or a capacitor is connected from the first gate to the second gate, or a conductive wire or a diode is connected from the drain region to the second gate. In the case of the third and fourth embodiments, two diodes or two capacitors are connected from the first gate to the second and third gates, or conductive wires or diodes are connected from the drain region to the second and third gates, respectively.

In the thin film transistor according to the present invention, since at least one subgate is provided in addition to the main gate, it is possible to form at least one pn junction induced by two different polarity electric fields in the channel forming region under between the source and drain region by applying a first voltage to the main gate and a second voltage to the subgate when the transistor turned off. As a result, it is possible to markedly reduce the turn-off leakage current flowing between the source and drain regions.

Further, it is possible to form at least one wide depletion layer induced by two same-polarity and different-intensity fields between the channel layer under the subgate and the source or drain region, it is possible to markedly reduce the turn-off leakage current flowing between the source and drain regions.

Further, since it is possible to simply modify the four-terminal thin film transistor including at least one subgate according to the present invention to the three-terminal device by connecting the main gate to the subgate via a diode or capacitor or by directly connecting the drain region to the subgate, when the transistor is being formed, the thin film transistor can be used in the same way as the ordinary three-terminal transistors.

Furthermore, since the thin film transistor can be formed in accordance with the ordinary transistor manufacturing process, without any special manufacturing steps, it is possible to improve the production yield and therefore manufacture the thin film transistor at low cost.

BRIEF DESCRIPTION OF THE DRAWINGS

FIGS. 1A, 1A-1 and 1A-2 are diagrammatical cross-sectional views showing a first prior-art thin film transistor, in which FIG. 1A shows the basic structure thereof, FIG. 1A-1 shows the turn-on state, and FIG. 1A-2 shows the turn-off state;

FIGS. 1B, 1B-1 and 1B-2 are diagrammatical cross-sectional views showing a second prior-art thin film transistor, in which FIG. 1B shows the basis structure thereof. FIG. 1B-1 shows the turn-on state, and FIG. 1B-2 shows the turn-off state;

FIGS. 2, 2-1, 2-2 are diagrammatical cross-sectional views showing a first embodiment of the thin film transistor according to the present invention, in which FIG. 2 shows the basic structure thereof, FIG. 2-1 shows the turn-on state, and FIG. 2—2 shows the turn-off state;

FIG. 2D, 2D-1 and 2D-2 are diagrammatical cross-sectional views showing a fourth modification of the first embodiment of the thin film transistor according to the present invention, in which FIG. 2D shows the basic structure thereof, FIG. 2D-1 shows the turn-on state, and FIG. 2D-2 shows the turn-off state, respectively;

FIGS. 3, 3-1, 3-2 are diagrammatical cross-sectional views showing a second embodiment of the thin film transistor according to the present invention, in which FIG. 3 shows the basic structure thereof, FIG. 3-1 shows the turn-on state, and FIG. 3-2 shows the turn-off state, respectively;

FIGS. 4, 4-1, 4-2, and 4-3 are diagrammatical cross-sectional views showing a third embodiment of the thin film transistor according to the present invention, in which FIG. 4 shows the basic structure thereof, FIG. 4-1 shows the turn-on state, and FIG. 4-2 shows the turn-off state, respectively;

FIGS. 5, 5-1, 5-2 are diagrammatical cross-sectional views showing a fourth embodiment of the thin film transistor according to the present invention, in which FIG. 5 shows the basic structure thereof, FIG. 5-1 shows the turn-on state, and FIG. 5-2 shows the turn-off state;

FIG. 6C shows an example in which the channel forming region is formed in different way from the source and drain regions;

FIGS. 9A, 9B, 9C and 9D are diagrammatical cross-sectional views showing the first embodiment of the thin film transistor (shown in FIG. 2), in which FIG. 9A shows a diode, FIG. 9B shows two diodes, FIG. 9C shows a wire and FIG. 9D shows a diode and a capacitor, respectively all in order to realize a three-terminal thin film transistor;

FIGS. 10A, 10B, 10C and 10D are diagrammatical cross-sectional views showing the third embodiment of the thin film transistor (shown in FIG. 4), in which FIG. 10A shows a diode and a wire, FIG. 10B shows four diodes, FIG. 10C shows wires, and FIG. 10D shows two diodes and two capacitors, respectively all in order to realize a three-terminal thin film transistor;

FIG. 11B corresponds to FIG. 10B; FIG. 11C corresponds to FIG. 10C and FIGS. 11D corresponds to FIG. 10D, respectively;

DETAILED DESCRIPTION OF THE PREFERRED EMBODIMENTS

With reference to the attached drawings, embodiments of the thin film transistor according to the present invention will be described hereinbelow. The feature of the present invention is to provide at least one additional subgate to the ordinary thin film transistor having a source, a drain and a gate, to reduce the turn-off leakage current.

The present invention will be explained in detail hereinbelow by taking the case of n-channel thin film transistor by way of example However, it is of course possible to apply the present invention to p-channel thin film transistor.

Figure 1A:
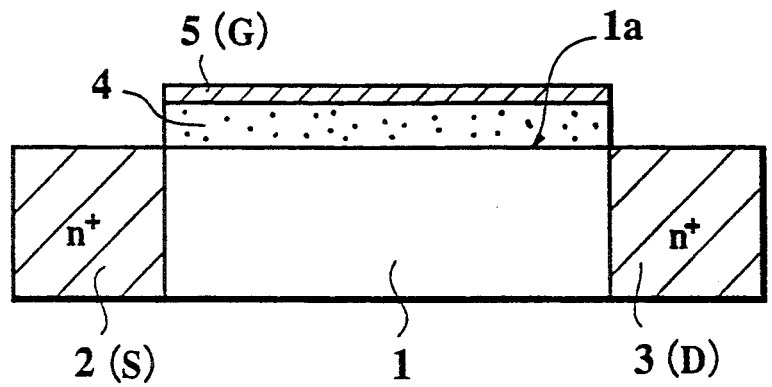
Figures 1, 1A:
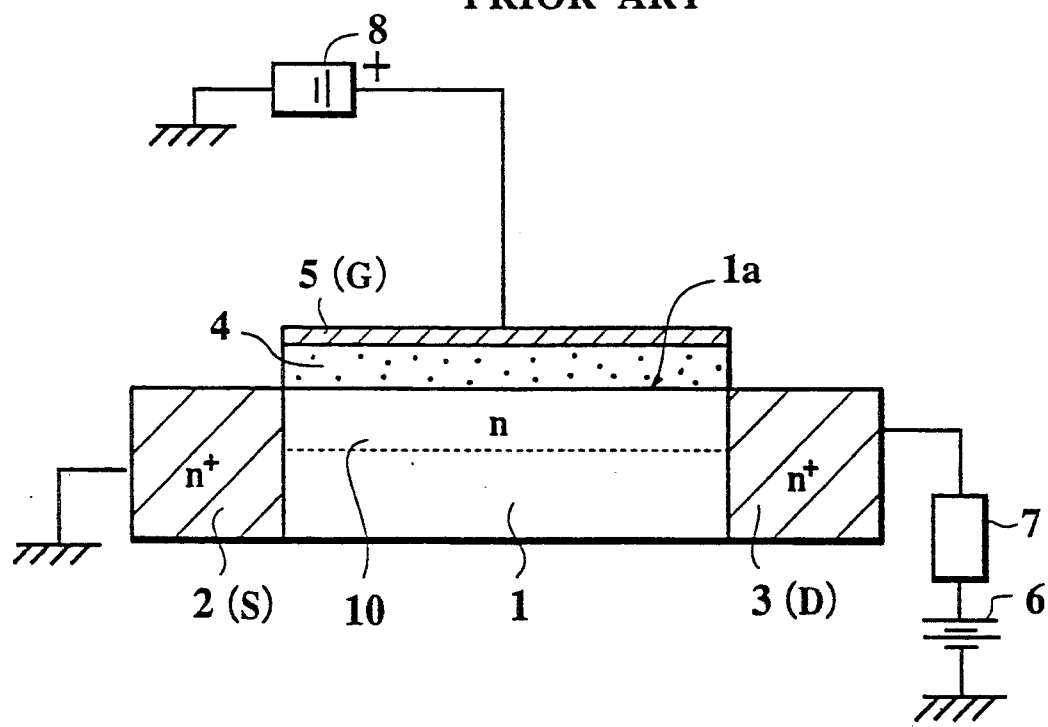
Figures 1, 1A, 2:
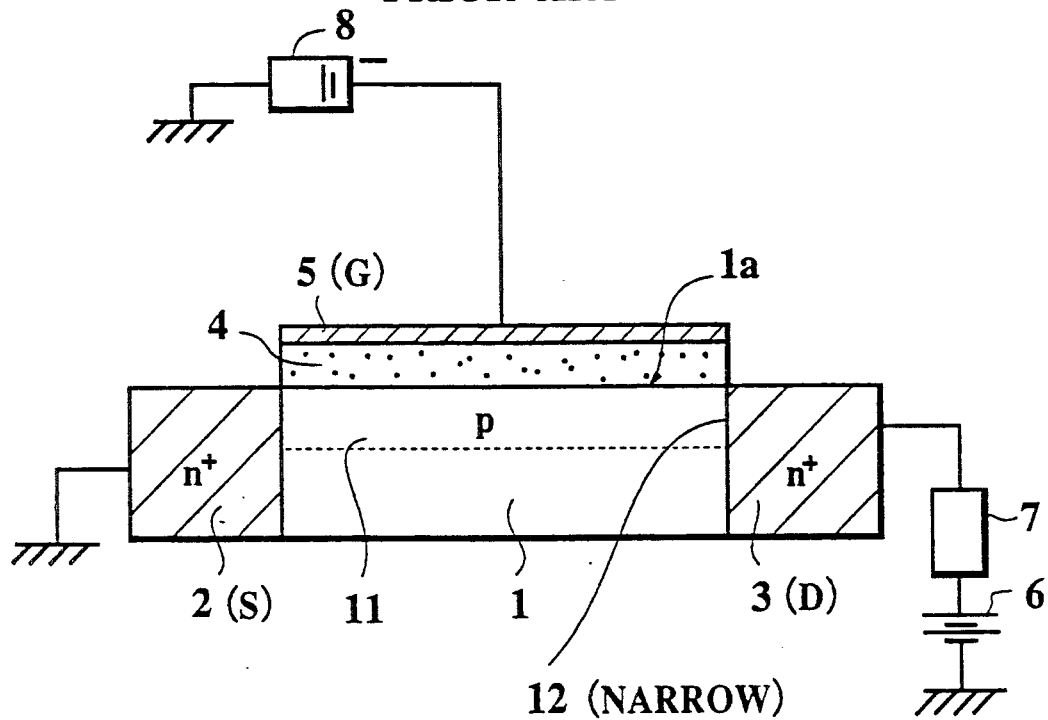

FIG. 2 shows a first embodiment thereof The thin film transistor comprises a channel forming region 1, a source region 2, a drain region 3, a first gate insulating film 41, a second gate insulating film 42, a first gate electrode 51, and a second gate electrode 52.

The channel forming region 1 is formed of a semiconductor thin film having neither n-type nor p-type impurity doped intentionally or a sufficiently low n-type or p-type impurity concentration. The source and drain regions 2 and 3 are formed of a semiconductor thin film having a sufficiently high n-type or p-type impurity concentration, respectively, as compared with that of the channel forming region 1, at first and second positions adjoining to the channel forming region 1, respectively. The source and drain regions 2 and 3 can be formed by implanting n-type or p-type impurity into the channel forming region 1 of a polycrystal semiconductor (e.g. polysilicon) at two different positions (two opposing sides) of the channel forming region 1. Therefore, the channel forming region 1 is a range formed between the source and drain regions 2 and 3 by implanting impurity into a thin film substrate. Further, it is also possible to form the semiconductor thin film of the source and drain regions 2 and 3 separately from the semiconductor thin film of the channel forming region 1. The semiconductor thin film of the channel forming region 1 and the source and drain regions 2 and 3 is a microcrystal, polycrystal or amorphous semiconductor.

The first gate electrode 51 is formed over a principal plane 1a of the channel forming region 1 and near the source region 2 so as to cover a range between the source and drain regions 2 and 3, via a first gate insulating film 41. The second gate electrode 52 is also formed over the principal plane 1a of the channel forming region 1 and near the drain region 3 so as to cover a range between the source and drain regions 2 and 3 over which the first gate electrode 51 is not formed, via a second gate insulating film 42.

The first and second gate insulating films 41 and 42 are physically connected to each other or overlapped and extend all over the principal plane 1a between the source and drain regions 2 and 3. Further, although not shown, the first and second gate electrodes 51 and 52 are physically overlapped or connected to or disconnected from each other. The first and second gate insulating films 41 and 42 are formed of the same material (e.g. $SiO_2$), and the thickness of the first gate insulating film 41 is the same as that of the second gate insulating film 42.

The function of the first embodiment of the thin film transistor according to the present invention will be described hereinbelow.

As shown in FIG. 2-1, when positive control voltages are applied from a first control voltage supply 81 to the first gate electrode 51 and from a second control voltage supply 82 to the second gate electrode 52 with the source region 2 as zero voltage level, under the condition that a positive voltage is applied to the drain region 3 from a voltage supply 6 via a load 7, since a first n-type channel layer 101 is formed within the channel forming region 1 and under the first gate electrode 51 so as to expand from the first gate insulating film 41 in the direction opposite to the first gate electrode 51 and extend to the source region 2, and additionally a second n-type channel layer 102 is formed within the channel forming region 1 and under the second gate electrode 52 so as to expand from the second gate insulating film 42 in the direction opposite to the second gate electrode 52 and extend to the drain region 3, the range between the source and drain regions 2 and 3 are turned on, so that current is supplied from the voltage supply 6 to the load 7.

Under these conditions, when a negative control voltage is applied from the first control voltage supply 81 to only the first gate electrode 51 with the source region 2 as zero voltage level as shown in FIG. 2-2, since a third p-type channel layer 103 is formed within the channel forming region 1 and under the first gate electrode 51 so as to expand from the first gate insulating film 41 in the direction opposite to the first gate electrode 51 and extend to the source region 2, a backward drain pn junction 100 is formed between the second and third channel layers 102 and 103 in reverse polarity relationship with respect to the voltage supply 6, so that the range between the source and drain regions 2 and 3 is turned off and therefore current is not supplied from the voltage supply 6 to the load 7.

Accordingly, the thin film transistor shown in FIG. 2 can be preferably used as a switching element.

In the prior-art transistor shown in FIG. 1A, the drain junction 12 is formed between the drain region 3 and the p-type channel layer 11 formed under the first (main) gate 5. In contrast, in the present invention, an effective drain junction 100 is formed between the n- type channel layer 102 induced by an electric field under the second (sub) gate 52 and the p-type channel layer 103 formed under the first (main) gate 51, as depicted in FIG. 2-2. In the case of the drain junction 12 formed between the drain region 3 and the channel layer 11, there exists a problem in that many additional traps are inevitably produced during the manufacturing process (e.g. during the source and drain formation process) and therefore leakage current inevitably flows therethrough. In the case of the drain junction 100 formed between the p-type channel layer 103 and the n-type channel layer 102, since the drain junction 100 and these two channel layers 103 and 102 are both induced in the channel forming region 1 by electric fields generated under the first and second gates 51 and 52, respectively, the additional traps produced of the drain junction 12 are not produced and therefore it is possible to markedly reduce the leakage current when the transistor is kept turned off. Here, the traps are lattice defects or impurity atoms which acquire carriers (i.e. electrons and holes).

Figure 1B:
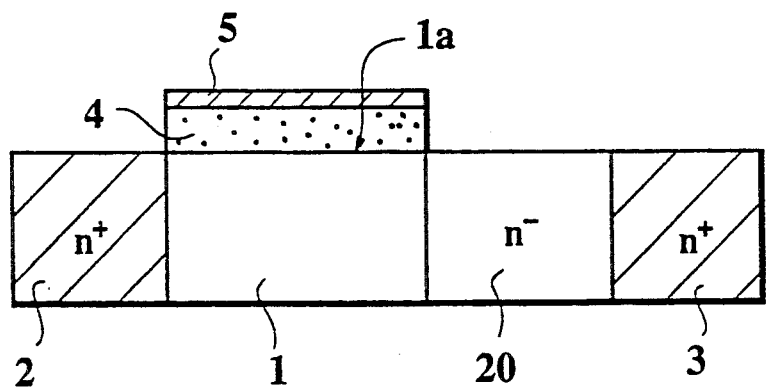
Figures 1, 1B:
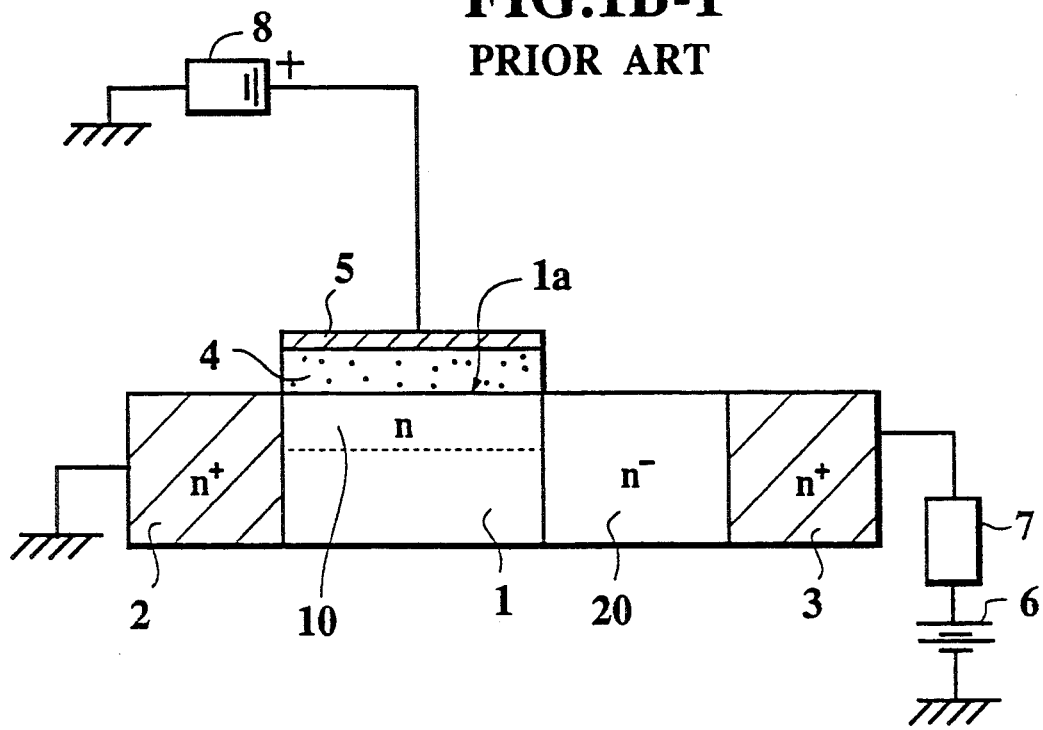
Figures 1, 1B, 2:
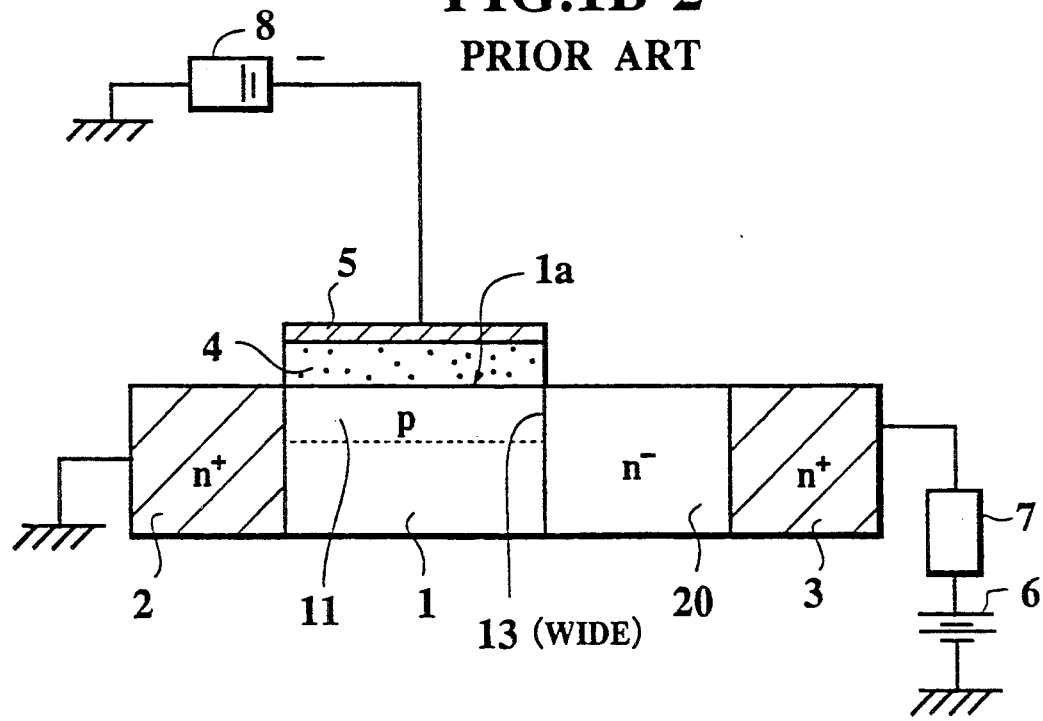

Further, in the prior-art method as explained with reference to FIG. 1B, the carrier concentration must be decreased and therefore the resistance must be increased in the offset area 20 in order to reduce the off current. In contrast, in the thin film transistor according to the present invention, since the n-type layer carrier concentration formed under the second gate electrode can be controlled by changing the voltage applied to the second electrode, the film thickness, the dielectric constant and the fixed charge of the second gate insulating film, without exerting any influence upon the off current characteristics, there exists an advantage in that it is possible to easily prevent the on current from being reduced.

That is, when the voltage applied to the second gate electrode 52 is constant, the smaller the thickness of the insulating film is and larger the dielectric constant of the insulating film is, the larger will be the fixed charge and therefore the higher will be the electric field, with a result that the higher will be the carrier concentration (for instance, refer to S. M. Sze. Physics of Semiconductor (John Wiley & Sons, New York, 1981) ch. 7.2).

Figure 2:
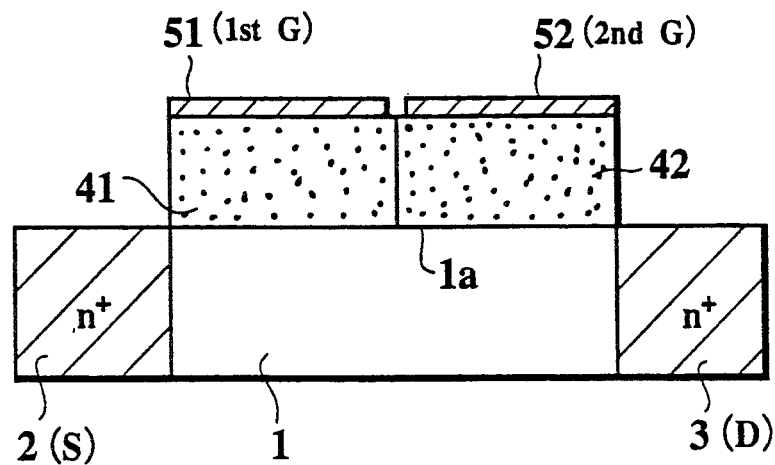
Figures 1, 2:
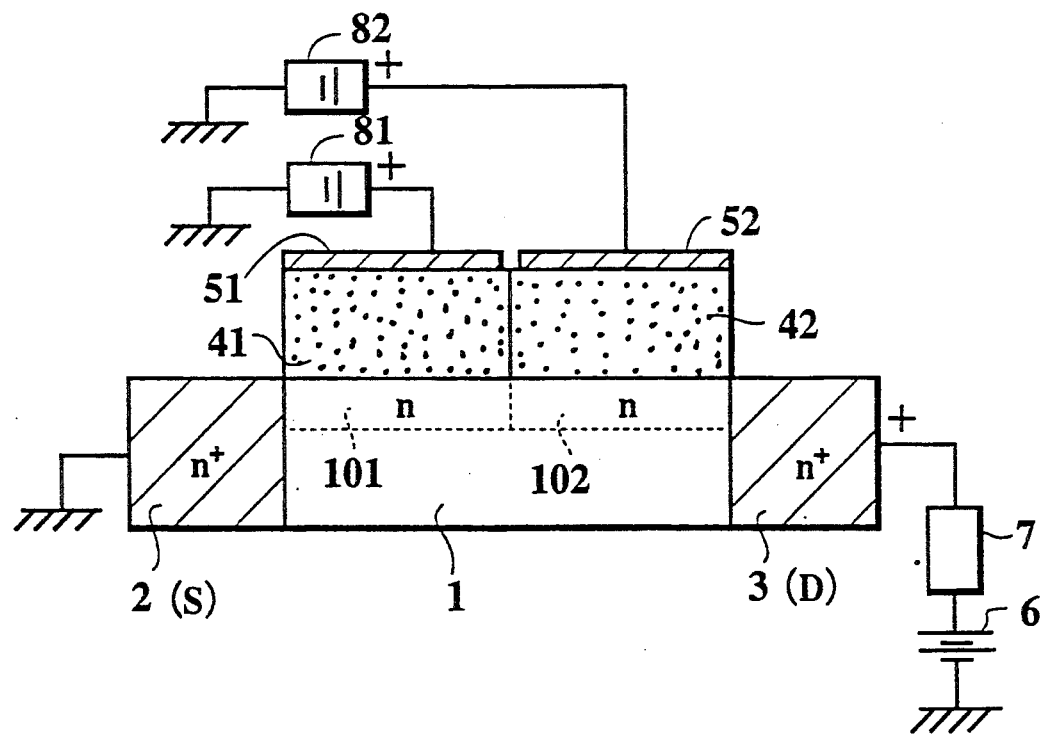
Figure 2:
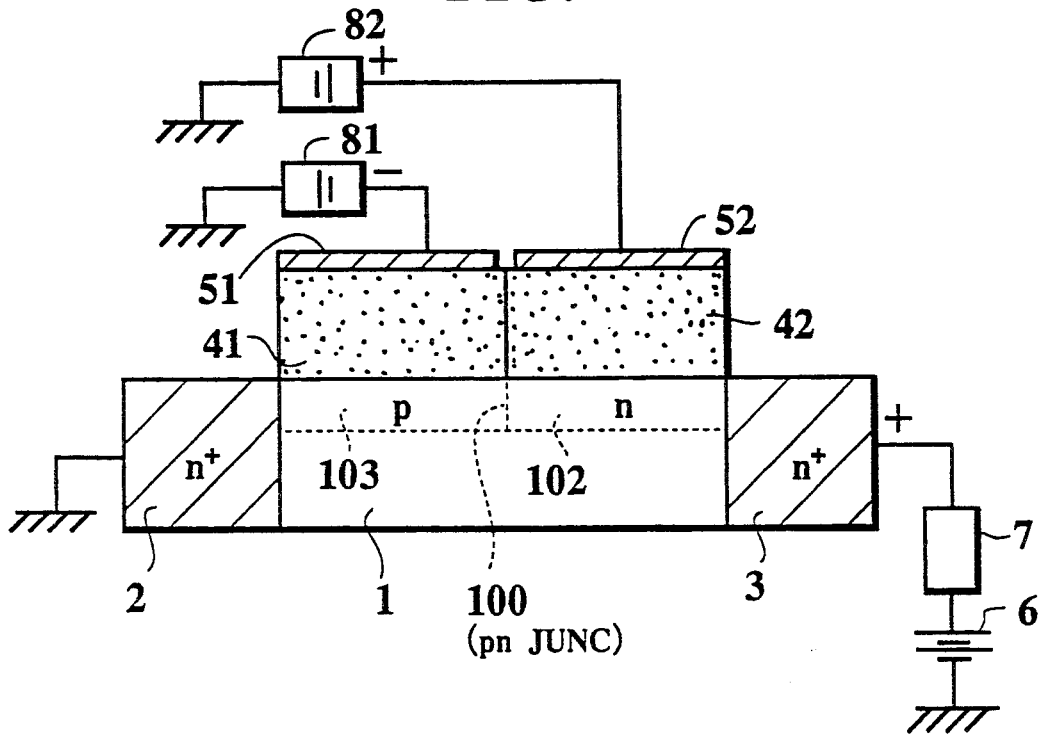
Figure 2A:
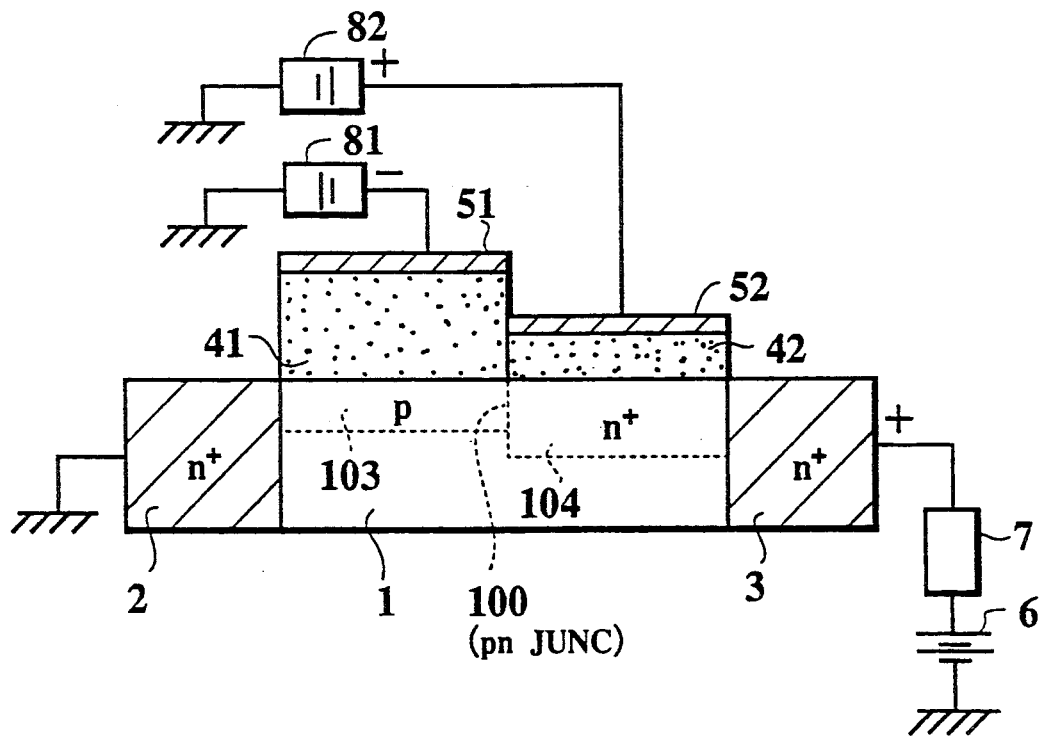
FIGS. 2A, 2B and 2C are diagrammatical cross-sectional views showing first, second and third modifications of the first embodiment of the thin film transistor according to the present invention, respectively.

FIG. 2A shows a first modification of the first embodiment of the thin film transistor according to the present invention, in which the thickness of the second gate insulating film 42 is determined smaller than that of the first gate insulating film 41. In this modification, as far as the absolute value of the gate voltage applied to the first and second gate electrodes 51 and 52 is constant, since a higher electric field is generated under the second gate electrode 52 via the second thin gate insulating film 42, it is possible to increase the carrier concentration (n+) in the channel layer 104 formed under the second gate electrode 52, so that it is possible to eliminate a difference in carrier concentration between the drain 3 and the channel layer 104. Therefore, there exists such an advantage that the on current can be increased as compared with the transistor shown in FIG. 2.

Figure 2B:
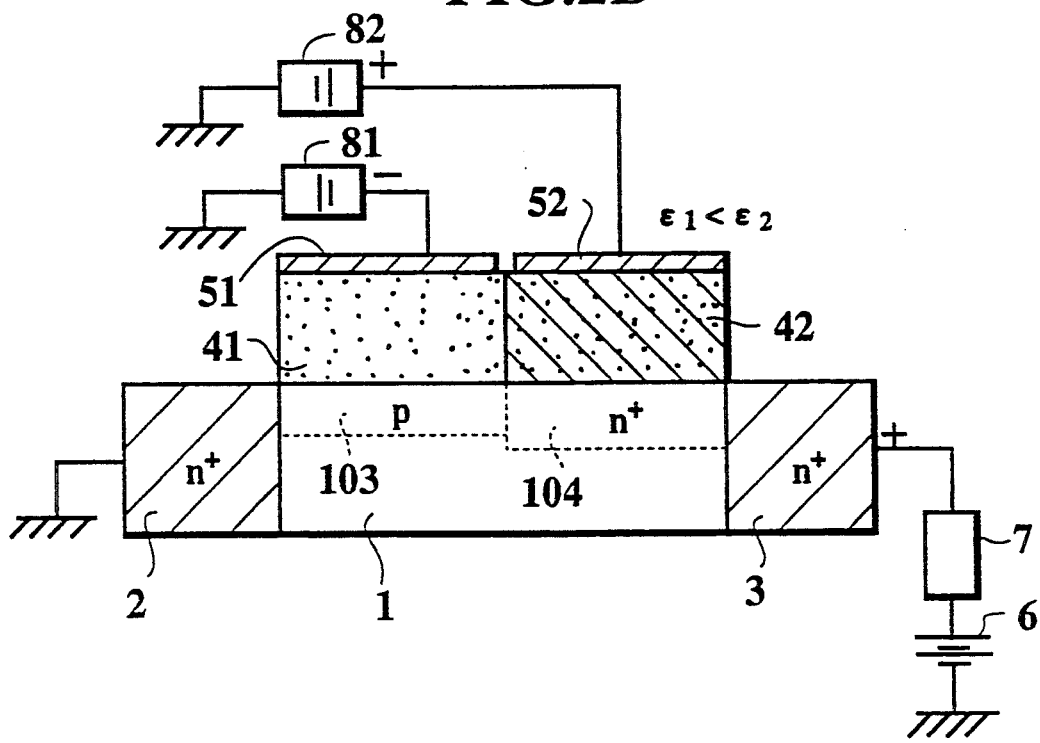

FIG. 2B shows a second modification of the first embodiment, in which the dielectric constant $\epsilon_2$ of the second gate insulating film 42 is determined larger than that $\epsilon_1$ of the first gate insulating film 41. In this modification, as far as the absolute value of the gate voltage is constant, since a higher electric field is generated under the second gate electrode 52, it is possible to increase the carrier concentration (n+) in the channel layer 104 formed under the second gate electrode 52, thus increasing the on current in the same way as in the first modification of the first embodiment shown in FIG. 2A.

Figure 2C:
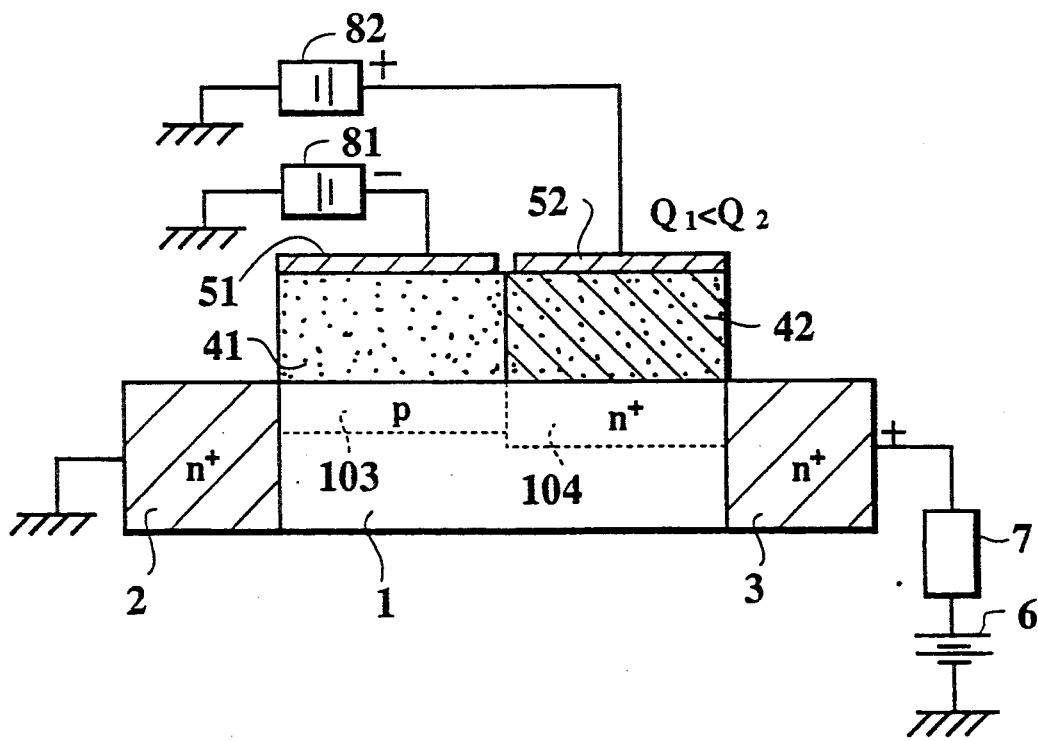

FIG. 2C shows a third modification of the first embodiment, in which the fixed charge $Q_2$ of the second gate insulating film 42 is determined much larger than that $Q_1$ of the first gate insulating film 41. In this modification, since a higher electric field is generated under the second gate electrode 52, it is possible to obtain the same advantage as in the first and second modifications of the first embodiment shown in FIGS. 2A and 2B.

In the above-mentioned first, second and third modifications shown in FIGS. 2A, 2B and 2C, the turn-off leakage current is reduced by the drain junction 100 formed between the third and fourth channel layers 103 and 104 within the channel forming region 1. In contrast, in the fourth, fifth and sixth modifications of the first embodiment shown in FIG. 2D, the turn-off leakage current is reduced by the drain junction 110 formed between the drain region 3 and the fourth channel layer 104.

Figure 2D:
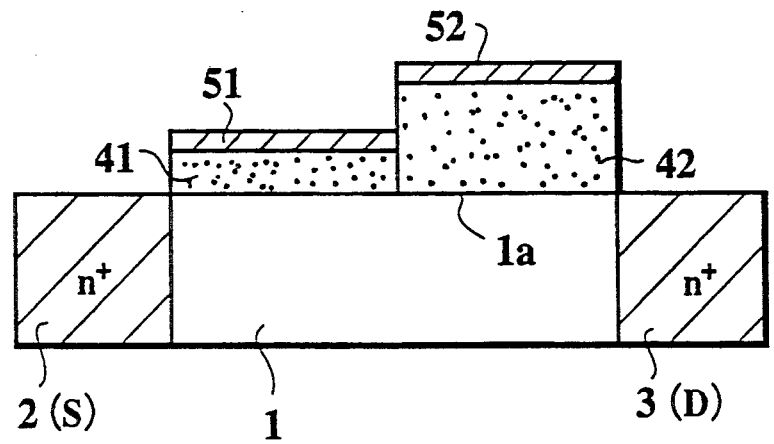
Figures 1, 2D:
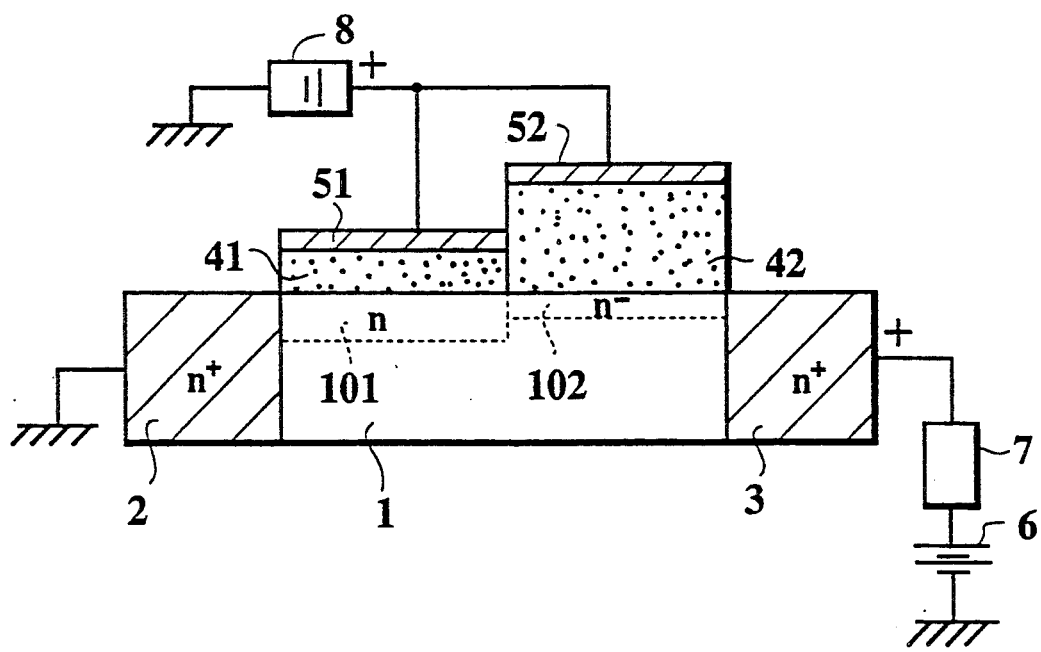
Figures 2, 2D:
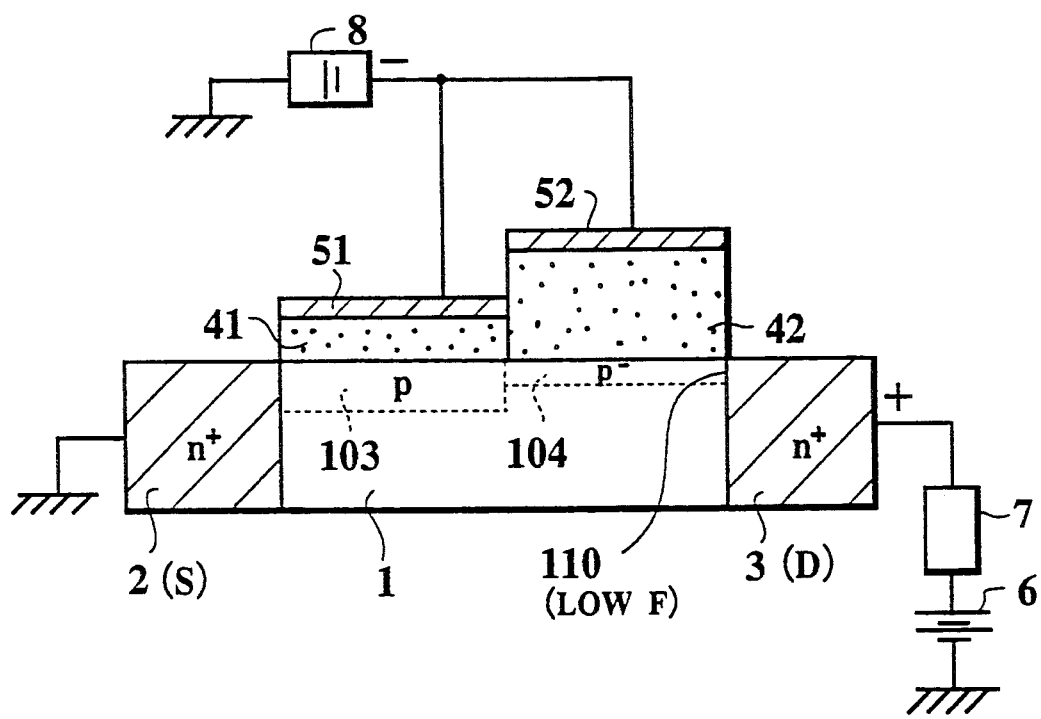

FIG. 2D shows a fourth modification of the first embodiment, in which the thickness of the second gate insulating film 42 is determined larger than that of the first gate insulating film 41, being different from the first embodiment shown in FIG. 2.

The function of this modification will be described with reference to FIGS. 2D-1 and 2D-2. As shown in FIG. 2D-1, when a positive control voltage is applied from a common control voltage supply 8 to the first and second gate electrodes 51 and 52 with the source region 2 as zero voltage level, under the condition that a positive voltage is applied to the drain region 3 from a voltage supply 6 via a load 7, since a first n-type channel layer 101 is formed within the channel forming region 1 and under the first gate electrode 51 so as to expand from the first gate insulating film 41 in the direction opposite to the first gate electrode 51 and extend to the source region 2, and additionally a second n-type channel layer 102 is formed within the channel forming region 1 and under the second gate electrode 52 so as to expand from the second gate insulating film 42 in the direction opposite to the second gate electrode 52 and extend to the drain region 3 and the first channel layer 101, the range between the source and drain regions 2 and 3 are turned on, so that current is supplied from the voltage supply 6 to the load 7.

Under these conditions, when a negative control voltage is applied from the control voltage supply 8 to the first and second gate electrodes 51 and 52 with the source region 2 as zero voltage level as shown in FIG. 2D-2, since a third p-type channel layer 103 is formed within the channel forming region 1 and under the first gate electrode 51 so as to expand from the first gate insulating film 41 in the direction opposite to the first gate electrode 51 and extend to the source region 2, and additionally a fourth p-type channel layer 104 is formed within the channel forming region 1 and under the second gate electrode 52 so as to expand from the second gate insulating film 42 in the direction opposite to the second gate electrode 52 and extend to the drain region 3 and the third channel layer 103, a pn junction 110 is formed between the drain region 3 and the fourth channel layer 104 in reverse polarity relationship with respect to the voltage supply 6, so that the range between the source and drain regions 2 and 3 is turned off and therefore current is not supplied from the voltage supply 6 to the load 7.

In the thin film transistor shown in FIG. 2D, as already explained, the third and fourth p-type channel layers 103 and 104 are formed within the channel forming region 1 when the transistor is turned from on (as shown in FIG. 2D-1) to off (as shown in FIG. 2D-2). In this turn-off state, however, a depletion layer is formed at the pn junction 110 between the n-type drain region 3 and the fourth p-type channel layer 104 in such a way as to extend toward both the drain region 3 and the fourth channel layer 104, respectively. In this embodiment, since the fourth channel layer 104 can be formed by a low electric field due to the thick second gate insulating film 42, the carrier concentration of the fourth channel layer 104 is sufficiently low. Therefore, it is possible to widen the width of the depletion layer extending toward the fourth channel layer 104. That is, the depletion layer 110 formed between the drain region 3 and the fourth channel layer 104 is relatively wide.

As a result, when the transistor is kept turned off, a relatively low electric field is generated at the depletion layer between the drain region 3 and the fourth channel layer 104. That is, when the transistor is kept turned off, a relatively small leakage current flows between the drain region 3 and the source region 2 through trops existing at both the depletion layers extending toward the drain region 3 and the fourth channel layer 104, as compared with the prior-art thin film transistor shown in FIG. 1A-2.

In the structure and the activating method shown in FIGS. 2D, 2D-1 and 2D-2, it is possible to change the film thickness, dielectric constant, and fixed charge of the second gate in the same way as previously shown in FIGS. 2-1 and 2-2. That is, when the film thickness of the second gate insulating film is increased or the dielectric constant is decreased or the fixed charge is reduced, it is possible to reduce the surface electric field of the semiconductor film under the second gate electrode, so that the carrier concentration of the p⁻region formed thereunder can be easily reduced, thus decreasing the off current.

Figure 3:
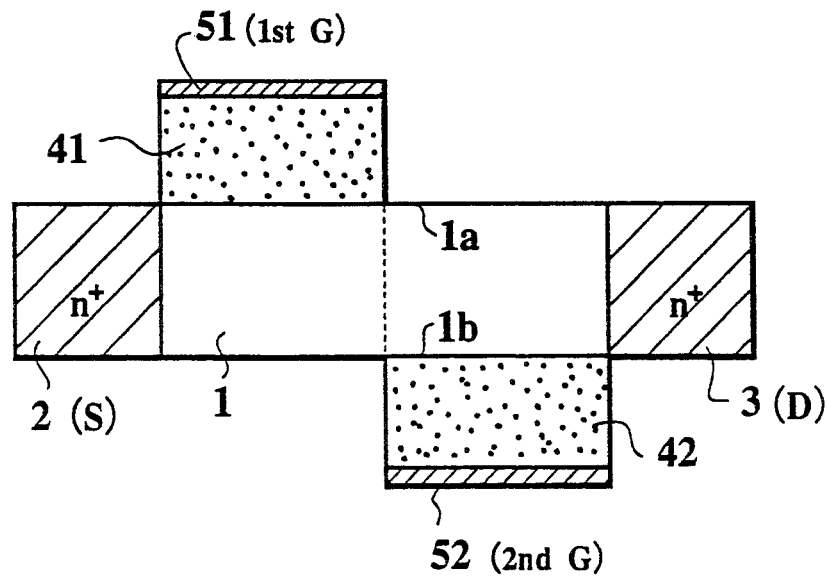
Figures 1, 3:
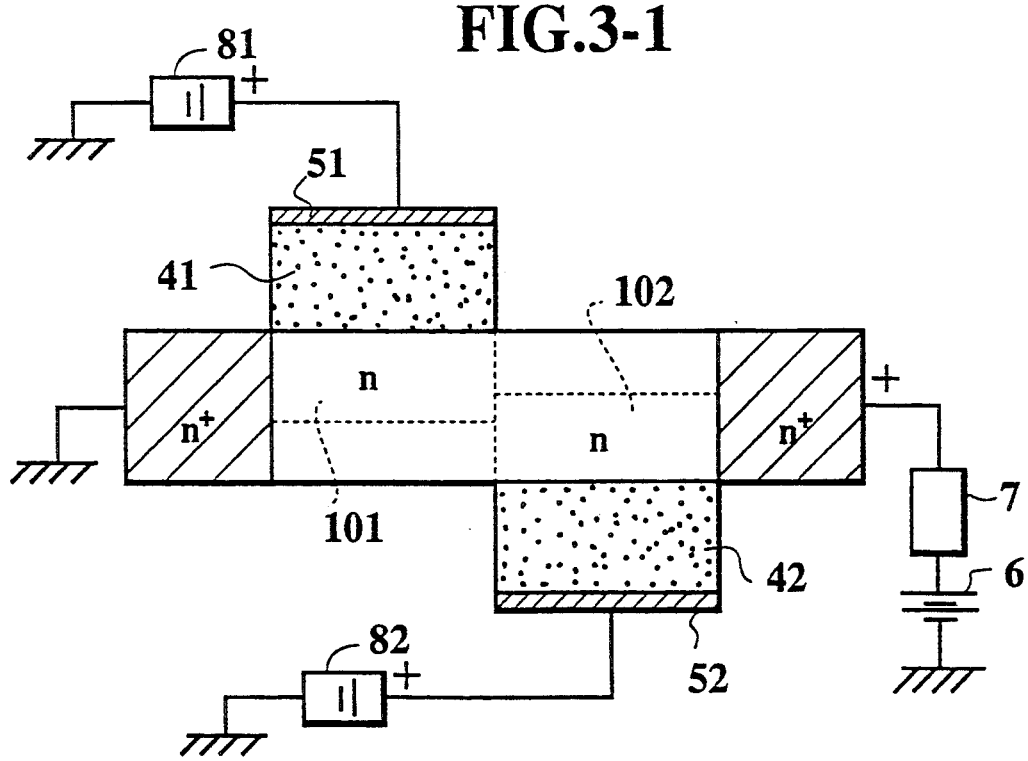

FIG. 3 shows a second embodiment of the thin film transistor according to the present invention. In this embodiment, the second gate electrode 52 and the second gate insulating film 42 are formed on another principal plane of the channel forming layer 1.

In more detail, the first gate electrode 51 and the first gate insulating film 41 are formed on a first principal plane 1a of the channel forming region 1, and the second gate electrode 52 and the second gate insulating film 42 are formed on a second principal plane 1b opposite to the first principal plane 1a.

FIG. 3-1 shows the turn-on state where two positive control voltages are applied to the first and second gate electrodes 51 and 52, respectively and FIG. 3-2 shows the turn-off state where a negative control voltage is applied to the first gate electrode 51 and the positive control voltage is kept applied to the second gate electrode 52.

In this second embodiment, in the same way as in the first embodiment, an effective drain junction 100 is formed between the n-type channel layer 102 induced by an electric field under the second (sub-) gate electrode 52 and the p-type channel layer 103 formed under the first (main) gate electrode 51, as depicted in FIG. 3-2. Therefore, it is possible to markedly reduce the leakage current when the transistor is kept turned off.

In the structure shown in FIG. 3, in the same way as with the structure previously shown in FIG. 2, it is clear that the same effect can be expected by similarly charging the film thickness, the dielectric constant, and the fixed charge of the second gate insulating film and by charging the activation method to the first gate as explained with reference to FIGS. 2A to 2D-2.

Figure 4:
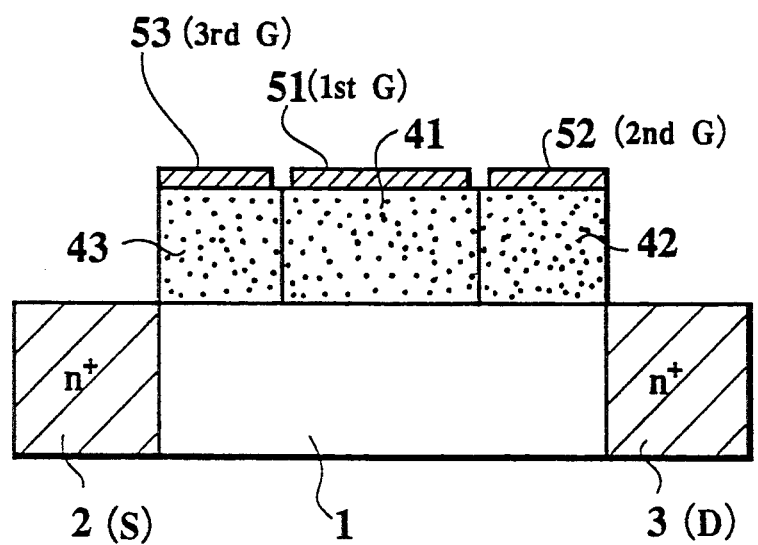
Figures 1, 4:
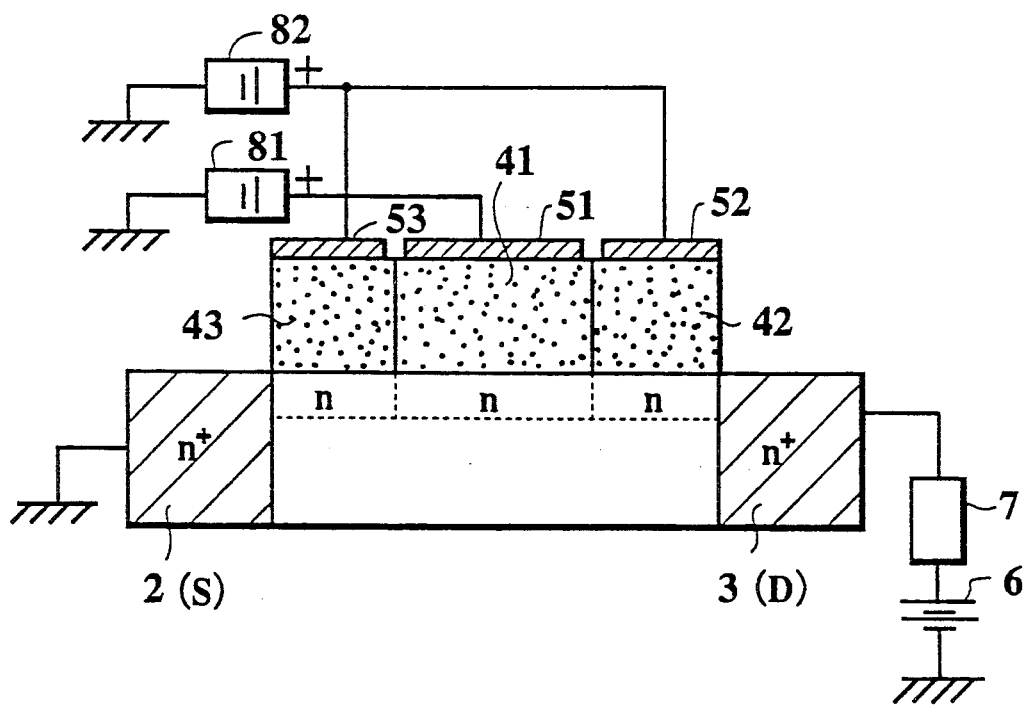
Figures 2, 4:
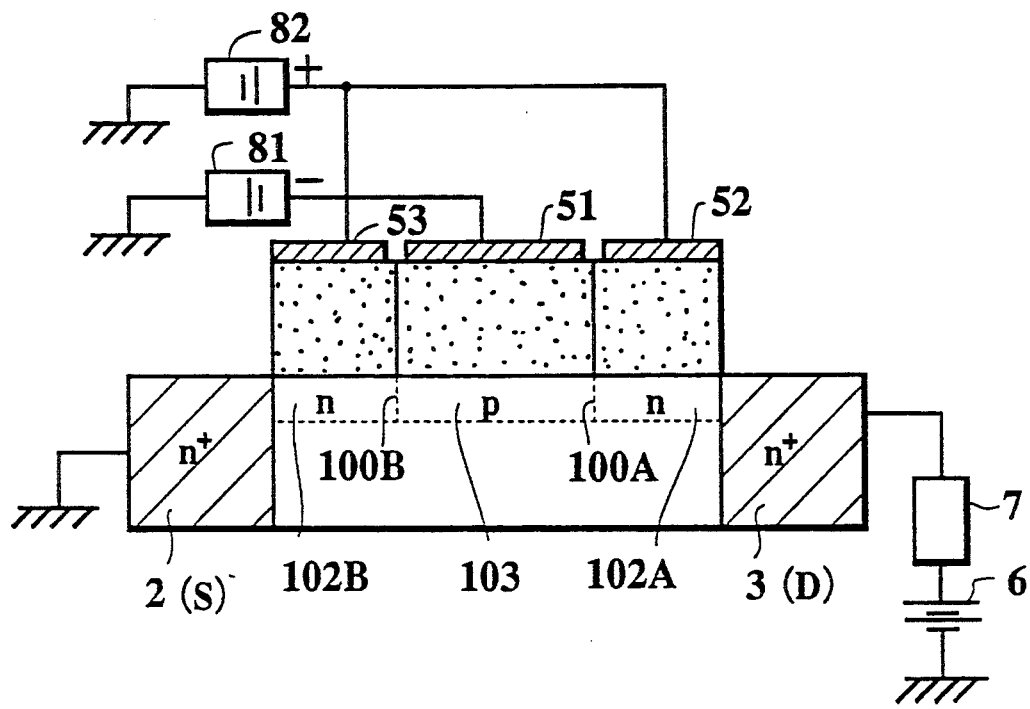
Figures 3, 4:
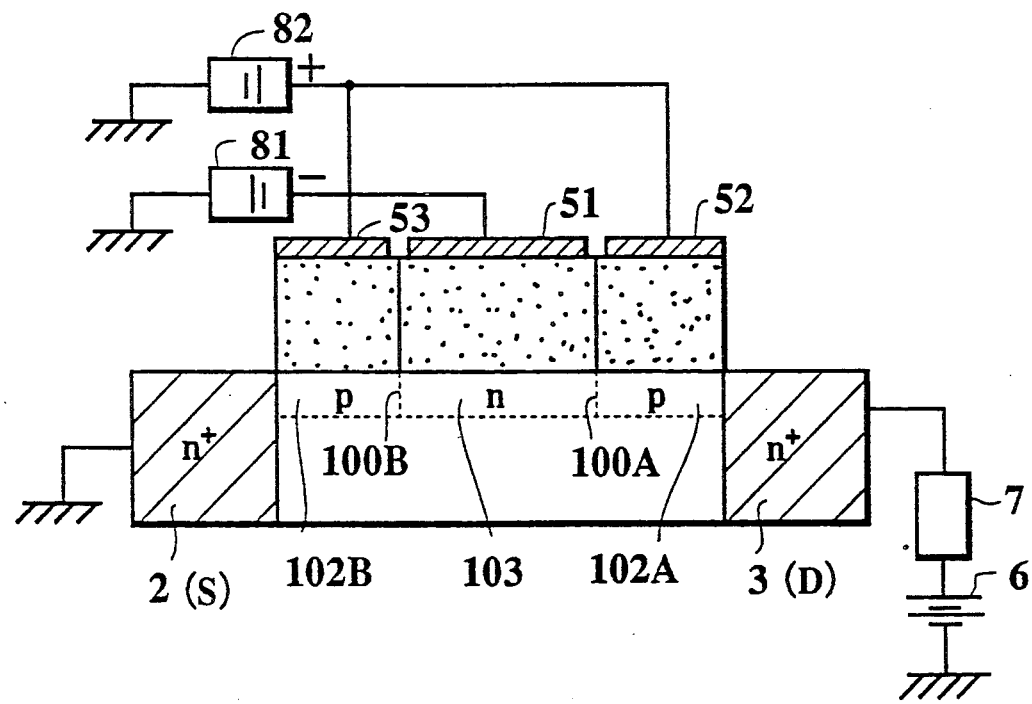

FIG. 4 shows a third embodiment of the thin film transistor according to the present invention. In this embodiment, a third control (second sub-) gate insulating film 43 is additionally formed on the same principal plane 1a of the channel forming region 1 in such a way that the first (main) gate electric 51 is interposed between the second and third (two sub-) gate electrodes 52 and 53.

FIG. 4-1 shows the turn-on state where two positive control voltages are applied to the first, second and third gate electrodes 51, 52 and 53, respectively and FIG. 4-2 shows the turn-off state where a negative control voltage is applied to the first gate electrode 51 and the positive control voltage is kept applied to the second and third gate electrodes 52 and 53.

In this third embodiment, in the same way as in the first and second embodiments, two effective drain junctions 100A and 100B can be formed between the p-type channel layer 103 formed under the first (main) gate electrode 51 and the n-type channel layers 102A and 102B induced by two electric fields under the second and third (two sub-) gate electrodes 52 and 53, respectively.

In this structure, accordingly, since these exist two backward biased pn junctions 100A and 100B at which leakage current can be suppressed sufficiently, it is possible to sufficiently suppress off current of the thin film transistor because the pn junction 100B is backward biased, even if these exists such a possibility that the polarity of the voltage supply 6 applied to the drain region 3 is reversed and therefore the pn junction 100A is forward biased.

Further, in the structure shown in FIG. 4, in the same way as with the structure previously shown in FIG. 2, it is clear that the same effect can be obtained by similarly changing the film thickness, the dielectric constant, and the fixed charge of the second insulating films and by changing the activation method to the second and third gates as explained with reference to FIGS. 2A to 2D-2.

Further, as another embodiment of the thin film transistor according to the present invention, it is possible to replace the function of the first gate with these of the second and third gates in the third embodiment. That is, the structure is such that a positive voltage is always applied to the first gate electrode, and the on/off states of the thin film transistor is controlled by a voltage applied to the second and third gate electrodes. When the transistor is turned off, since a negative voltage is applied to the second and third gate electrodes, p regions are formed under the second and third gate electrodes. Therefore, since two pn junctions 100A and 100B are formed between the p regions and the middle n region always formed under the first gate electrode as shown in FIG. 4-3, it is possible to sufficiently suppress the off current of the transistor, irrespective of the voltage applied to the drain in the same way as in the third embodiment. The feature of this embodiment is as follows: Since the n region formed under the first gate electrode is not directly connected to the source electrode under the turn-on condition, it is possible to increase the on current even if the carrier concentration of this area is not so high. Accordingly, these exists an advantage such that it is possible to reduce the voltage always applied to the first gate electrode.

In the structure of this embodiment, in the same way as with the structure previously shown in FIG. 2, it is clear that the same effect can be obtained by similarly changing the film thickness, the dielectric constant, and the fixed charge of the second gate insulating film and by changing the activation method to the first gate as explained with reference to FIGS. 2A to 2D-2.

Figure 5:
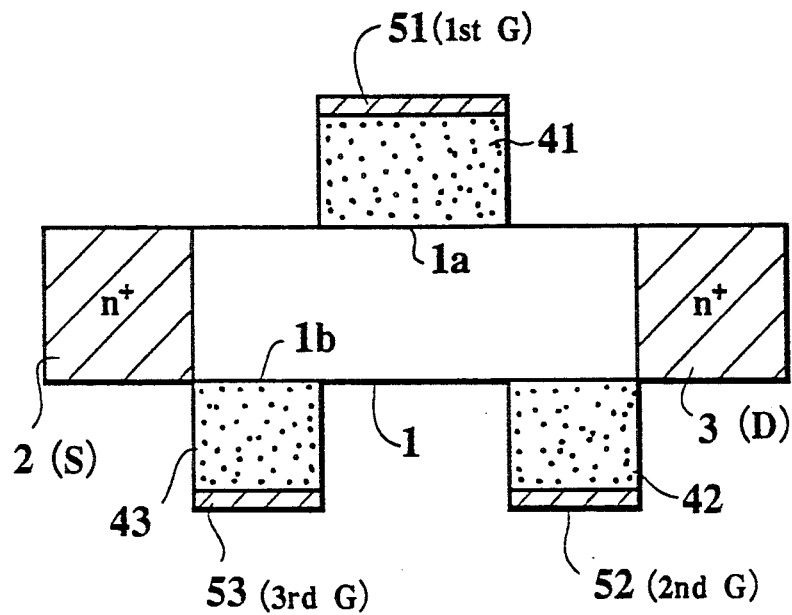
Figures 1, 5:
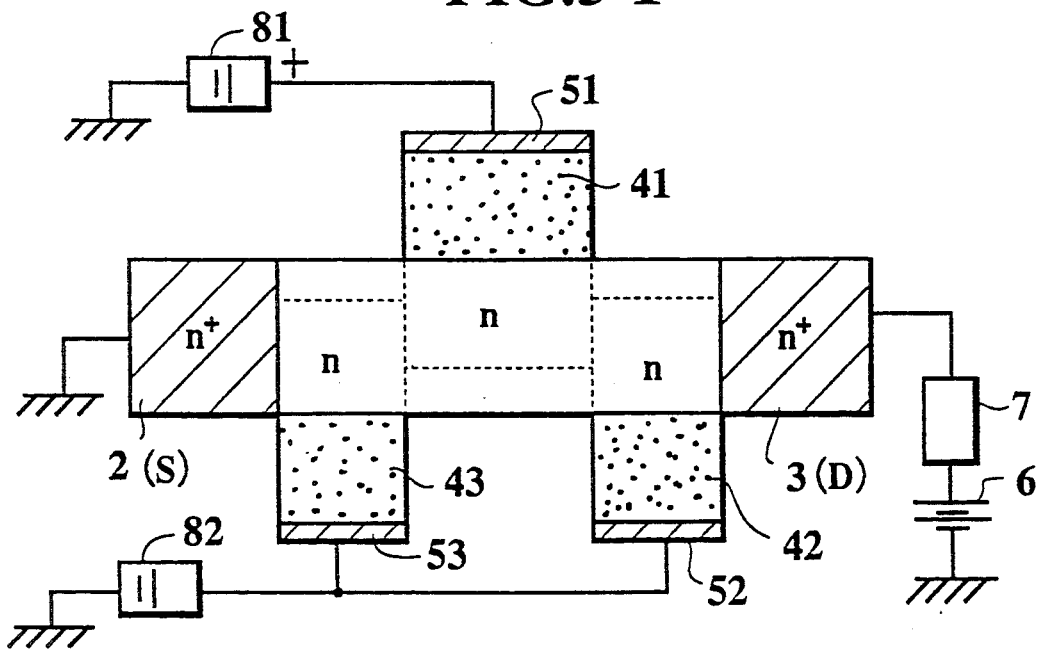
Figures 2, 5:
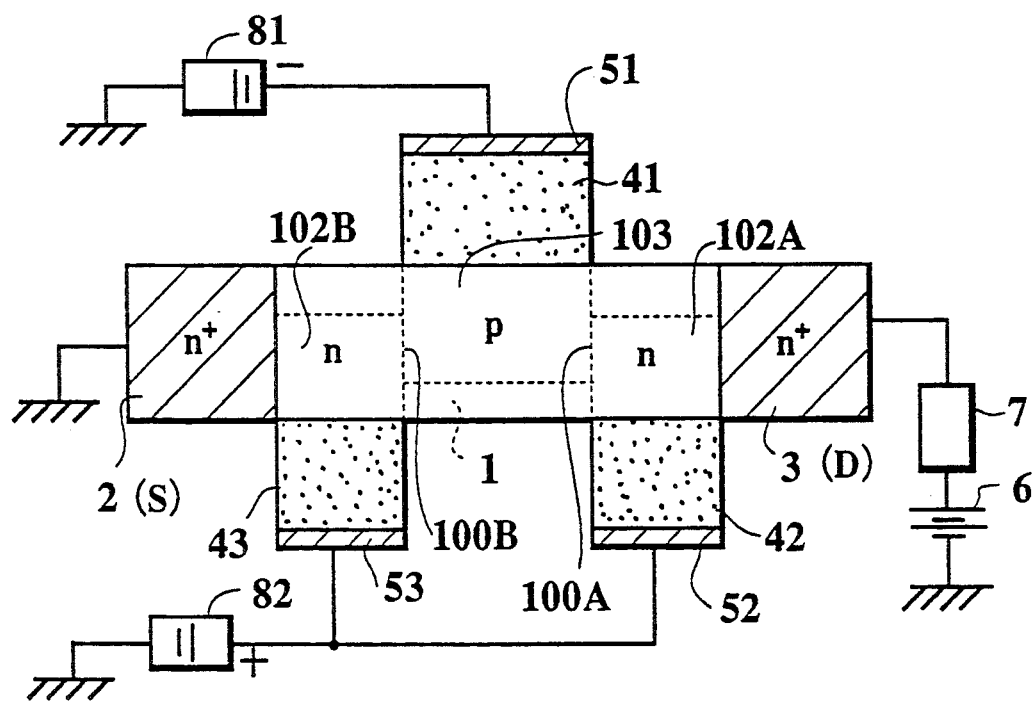

FIG. 5 shows a fourth embodiment of the thin film transistor according to the present invention. In this embodiment, the second and third gate electrodes 52 and 53 and the second and third gate insulating films 42 and 43 are formed on another principal plane 1b of the channel forming layer 1.

In more detail, the first gate electrode 51 and the first gate insulating film 41 are formed on a first principal plane 1a of the channel forming region 1, and the second and third gate electrodes 52 and 53 and the second and third gate insulating films 42 and 43 are formed on a second principal plane 1b opposite to the first principal plane 1a.

FIG. 5-1 shows the turn-on state where two positive control voltages are applied to the first, second and third gate electrodes 51, 52 and 53, respectively and FIG. 5-2 shows the turn-off state where a negative control voltage is applied to the first gate electrode 51 and the positive control voltage is kept applied to the second and third gate electrodes 52 and 53.

In this fourth embodiment, in the same way as in the second embodiment, effective drain junction 100A is formed between the n-type channel layer 102A induced by an electric field under the second (sub-) gate electrode 52 and the p-type channel layer 103 formed under the first (main) gate electrode 51, as depicted in FIG. 5-2. Therefore, it is possible to securely reduce the leakage current when the transistor is kept turned off.

In this structure, accordingly, since these exist two backward biased pn junctions 100A and 100B at which leakage current can be suppressed sufficiently, it is possible to sufficiently suppress off current of the thin film transistor because the pn junction 100B is backward biased, even if these exists such a possibility that the polarity of the voltage supply 6 applied to the drain region 3 is reversed and therefore the pn junction 100A is forward biased.

Further, in the structure shown in FIG. 5, in the some way as with the structure previously shown in FIG. 2, it is clear that the same effect can be obtained by similarly changing the film thickness, the dielectric constant, and the fixed charge of the second insulating films and by changing the activation method to the second and third gates as explained with reference to FIGS. 2A to 2D-2.

Further, as another embodiment of the thin film transistor according to the present invention, it is possible to replace the function of the first gate with these of the second and third gates in the fourth embodiment. That is, the structure is such that a positive voltage is always applied to the first gate electrode, and the on/off states of the thin film transistor is controlled by a voltage applied to the second and third gate electrodes. When the transistor is turned off, since a negative voltage is applied to the second and third gate electrodes, p regions are formed under the second and third gate electrodes. Therefore, since two pn junctions 100A and 100B are formed between the p regions and the middle n region always formed under the first gate electrode as shown in FIG. 4-3, it is possible to sufficiently impress the off current of the transistor irrespective of the voltage applied to the drain in the same way as in the fourth embodiment. The feature of this embodiment is as follows: Since the n region formed under the first gate electrode is not directly connected to the source electrode under the turn-on condition, it is possible to increase the on current even if the carrier concentration of this area is not so high. Accordingly, these exists an advantage such that it is possible to reduce the voltage always applied to the first gate electrode.

In the structure of this embodiment, in the same way as with the structure previously shown in FIG. 2, it is clear that the same effect can be obtained by similarly changing the film thickness, the dielectric constant, and the fixed charge of the second gate insulating film and by changing the activation method to the first gate as explained with reference to FIGS. 2A to 2D-2.

Figure 6A:
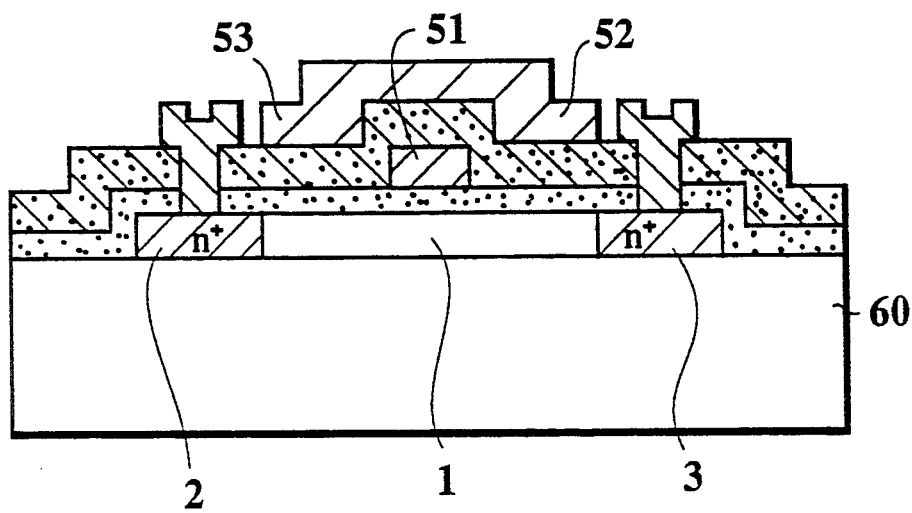
FIGS. 6A, 6B and 6C are more practical cross-sectional views showing the third modification of the third embodiment of the thin film transistor according to the present invention (shown in FIG. 4), in which the first, second and third gates are formed of different material and with different thickness, and further
Figure 6B:
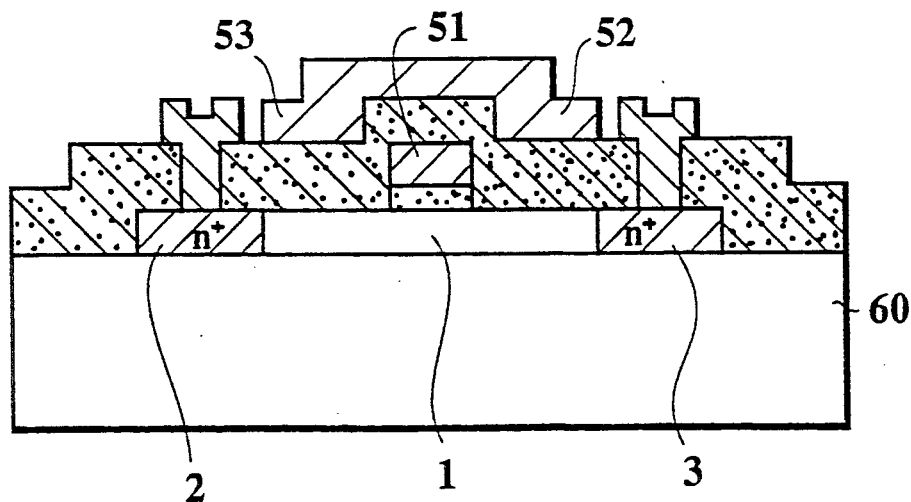

FIGS. 6A and 6B show more practical cross-sectional views showing the third embodiment of the thin film transistor using a pn junction produced by the gate voltage shown in FIGS. 4, 4-1, and 4-2. In these drawings, the thin film transistor is formed on an insulating glass substrate 60 in such a way that the first gate electrode 51 is separated from the second and third gate electrodes 52 and 53.

Figure 6C:
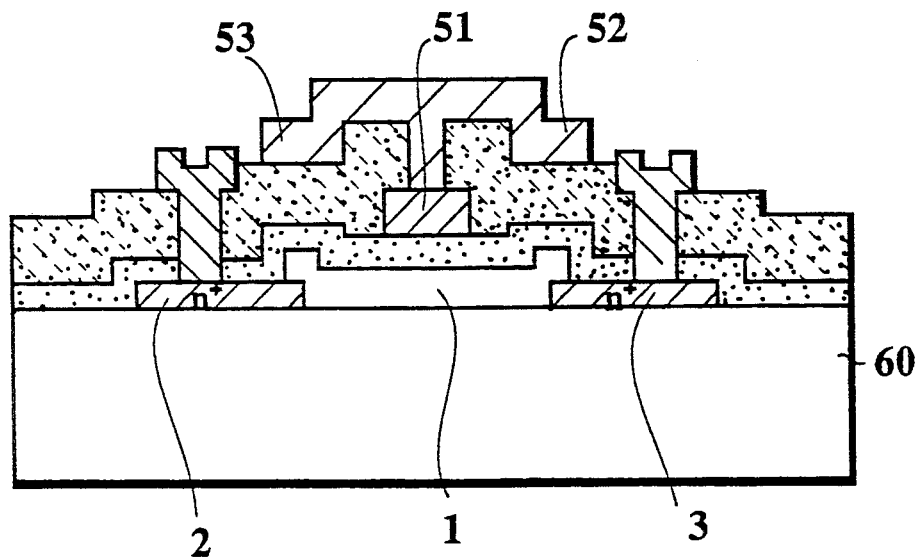

Further, FIG. 6C shows a similar more practical cross-sectional view showing the third embodiment of the thin film transistor using a pn junction produced by the gate voltage shown in FIGS. 4, 4-1, and 4-2. In this drawing, the source and drain regions 2 and 3 are formed by a manufacturing step different from that of forming the channel forming region 1.

Figure 7A:
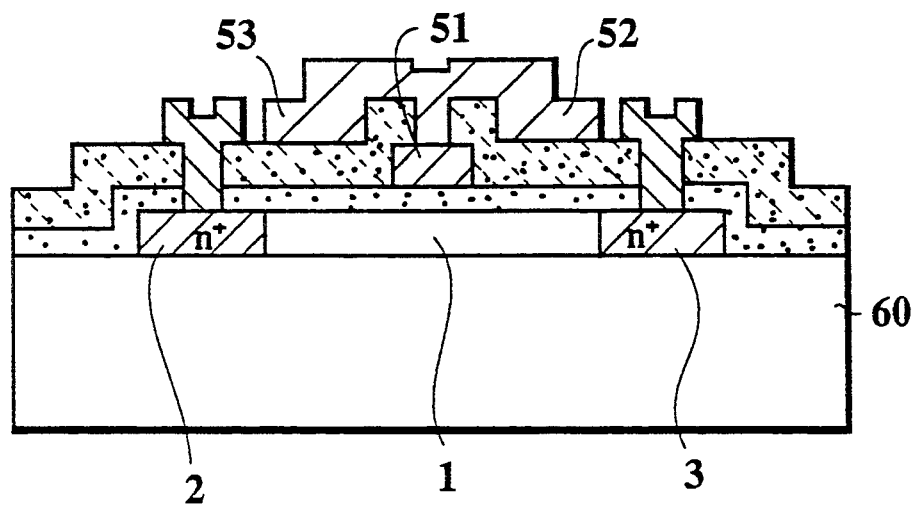
FIGS. 7A and 7B are more practical cross-sectional views showing the sixth modification of the third embodiment of the thin film transistor according to the present invention (show in FIG. 4), in which the first, second and third gates are formed of different material and with different thickness.
Figure 7B:
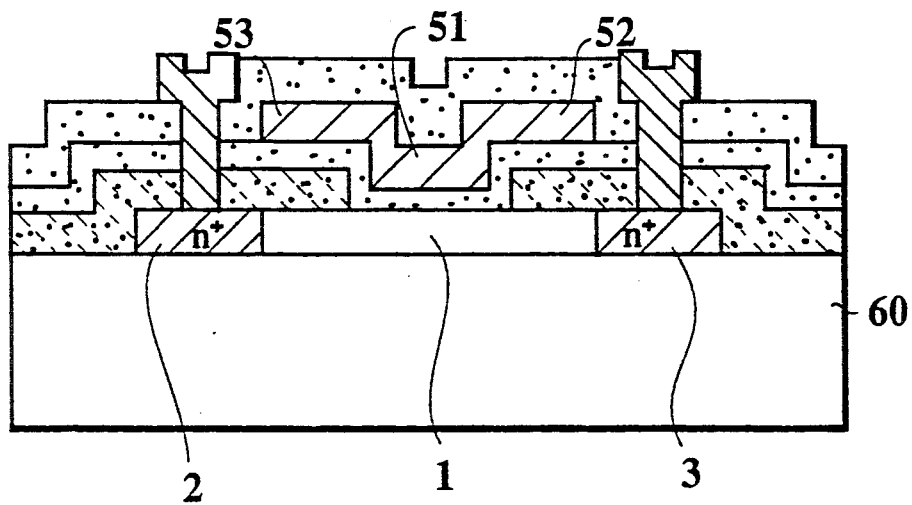

In the more practical embodiments as shown in FIGS. 6A and 7B, in the case where the third gate electrode 53 is eliminated and additionally the first gate electrode 51 is so formed as to be located adjacent to the source electrode 2, it is clear that the more practical structures than those of the embodiments shown in FIGS. 2 to 2D-2 can be obtain.

FIGS. 7A and 7B show more practical cross-sectional views showing the sixth modification of the third embodiment of the thin film transistor using a wide depletion layer shown in FIGS. 4, 4-1, and 4-2. In these drawings, the thin film transistor is formed on an insulating glass substrate 60 in such a way that the first gate electrode 51 is connected to the second and third gate electrodes 52 and 53.

Figure 8A:
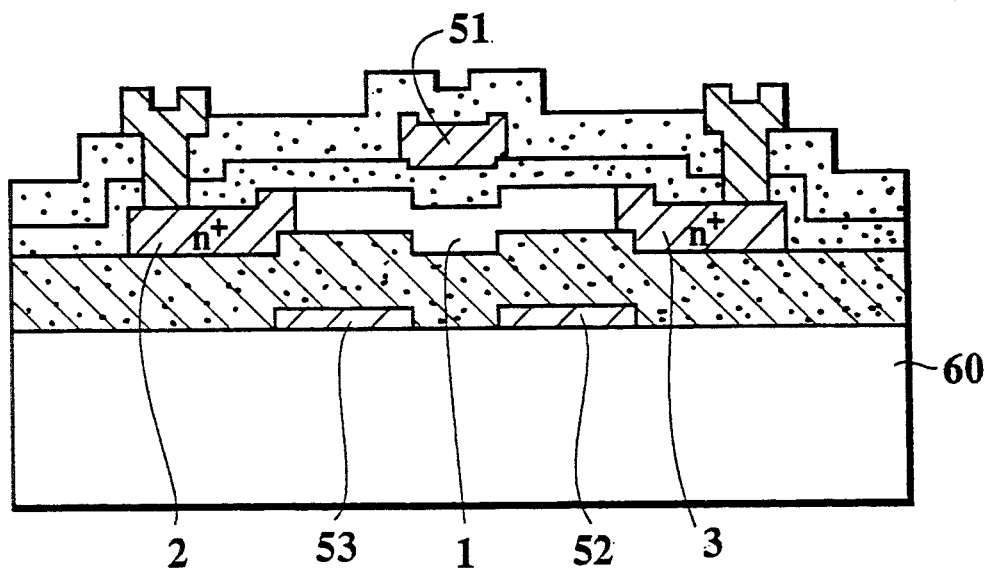
FIGS. 8A and 8B are more practical cross-sectional views showing the fourth modification of the fourth embodiment of the thin film transistor according to the present invention (shown in FIG. 5), in which the first, second and third gates are formed of the same material and with different thickness.
Figure 8B:
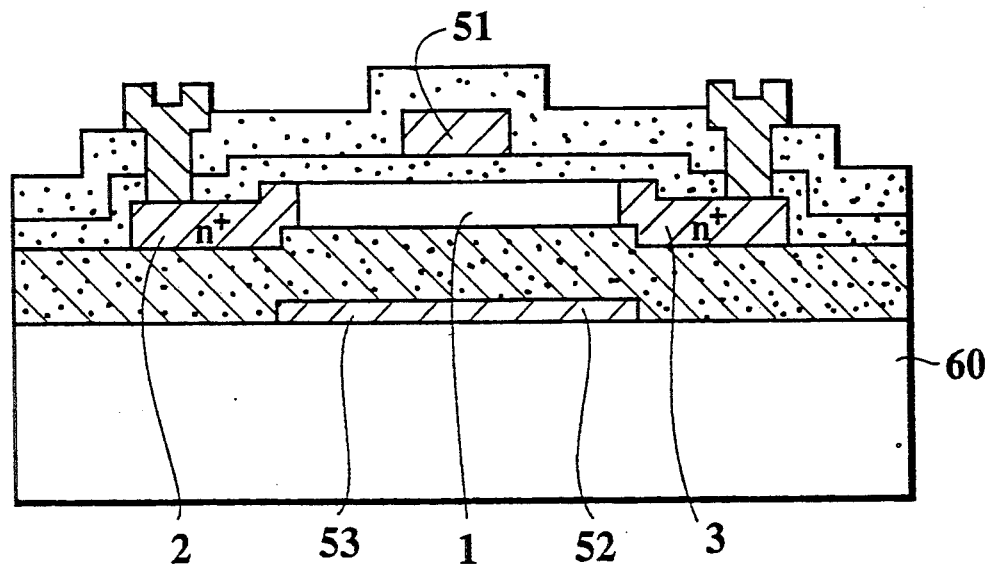

FIGS. 8A and 8B show more practical cross-sectional views showing the fourth embodiment of the thin film transistor shown in FIGS. 5, 5-1, and 5-2. In these drawings, the thin film transistor is formed on an insulating glass substrate 60 in such a way that the first gate electrode 51 is separated from the second and third gate electrodes 52 and 53.

In the more practical embodiments as shown in FIGS. 8A and 8B, in the case where the third gate electrode 53 is eliminated and additionally the first gate electrode 51 is so formed as to the located adjacent to the source electrode 2, it is clear that the more practical structures than that of the embodiment shown in FIG. 3 can be obtain.

In the thin film transistor according to the present invention, since at least one subgate is additionally formed, the transistor is of four-terminal element. In the case of the fourth, fifth and sixth modifications of the first to fourth embodiments, since the first (main) gate electrode 51 is connected externally to the second or third (sub-) gate electrode 52 or 53, it is possible consider these modifications as three-terminal elements. However, in the case of the basic, first second and third modifications of the first to fourth embodiments, since it is necessary to apply a negative voltage to the first (main) gate electrode 51 and a positive voltage to the second or third (sub-) gate electrode 52 and 53 in order to turn off the transistor, these embodiments or modifications are of four-terminal elements.

In the first embodiment of the thin film transistor shown in FIG. 2, although it is necessary to form the first and second gate insulating films 41 and 42 and the first and second gate electrodes 51 and 52, the manufacturing process of the first embodiment is not so complicated, as compared with that of the prior-art thin film transistor shown in FIG. 2A in which an offset region 20 of a semiconductor thin film is additionally formed between the channel forming region 1 and the drain region 3. In other words, in the case of the first embodiment of the present invention, it is possible to markedly reduce the leakage current of the thin film transistor without increasing the manufacturing cost thereof.

To modify these four-terminal transistors to three-terminal transistors in the form of devices formed on a substate, the various methods can be applied as described in further detail below.

FIGS. 9A, 9B, 9C and 9D show four methods of modifying the first embodiment of the four-terminal thin film transistor shown in FIG. 2 to a three terminal device.

Figure 9A:
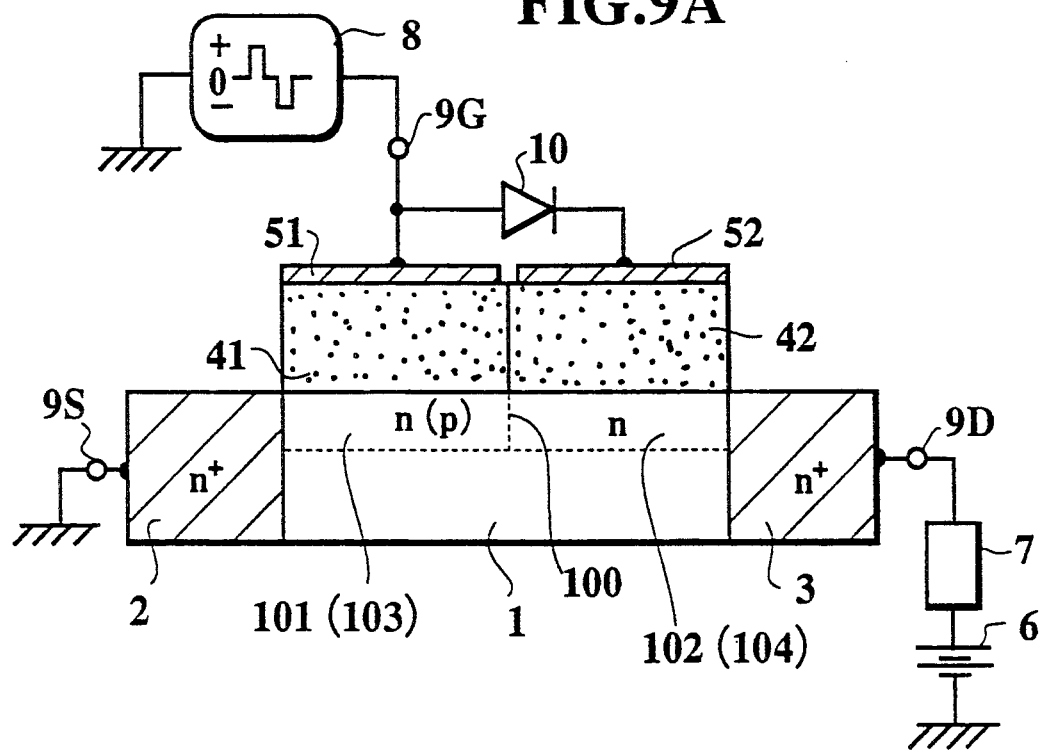

In FIG. 9A, a diode 10 is connected between the first gate electrode 51 and the second gate electrode 52 in the forward direction from the first gate electrode to second gate electrode. Therefore, when a positive control voltage is applied to both the first and second gate electrodes 51 and 52 to turn on the transistor, two n-type channel layers 101 and 102 can be formed under the first and second gate insulating films 41 and 42, respectively. On the other hand, when a negative control voltage is applied to both the first and second gate electrodes 51 and 52 to turn off the transistor, although a p-type channel layer 103 can be formed under the first gate insulating film 41, since the diode 10 is connected in the backward direction, a p-type channel layer is not formed under the second gate insulating film 42 or an n-type channel layer 102 is kept unchanged. Therefore, it is possible to form a pn drain junction 100 in the channel forming region 1 when the transistor is turned off, thus reducing the turn-off leakage current. This method is effective when a high switching frequency pulse signal is applied to the first and second gate electrodes 51 and 52. However, in the case of a low switching frequency pulse signal, since the carrier concentration of the channel layer 102 inevitably decreases with the lapse of time, this method is not necessarily effective.

Figure 9B:
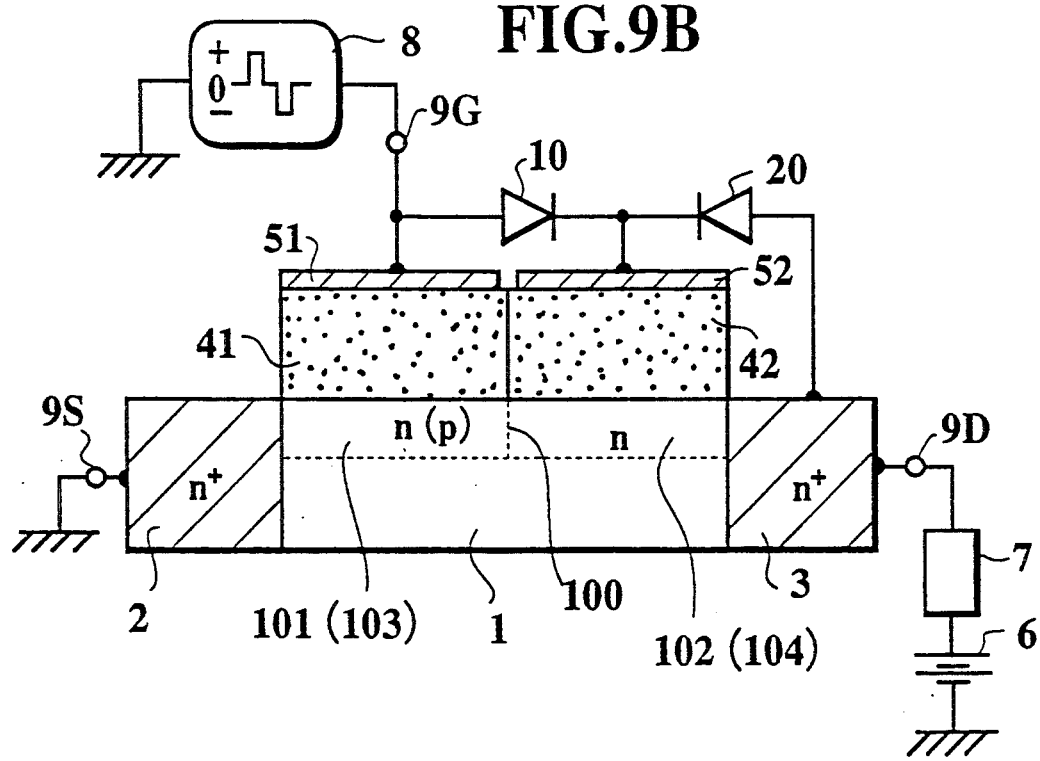

FIG. 9B shows another method, in which another diode 20 is connected between the second gate electrode 52 and the drain region 3 in the forward direction from the drain region 3 to the second gate electrode 52. In this method, since the n-type channel layer 104 can be kept formed under the second gate insulating film 42, irrespective of the turn-on or off condition of the transistor, it is possible to more reliably form a pn drain junction 100 in the channel forming region 1.

Figure 9C:
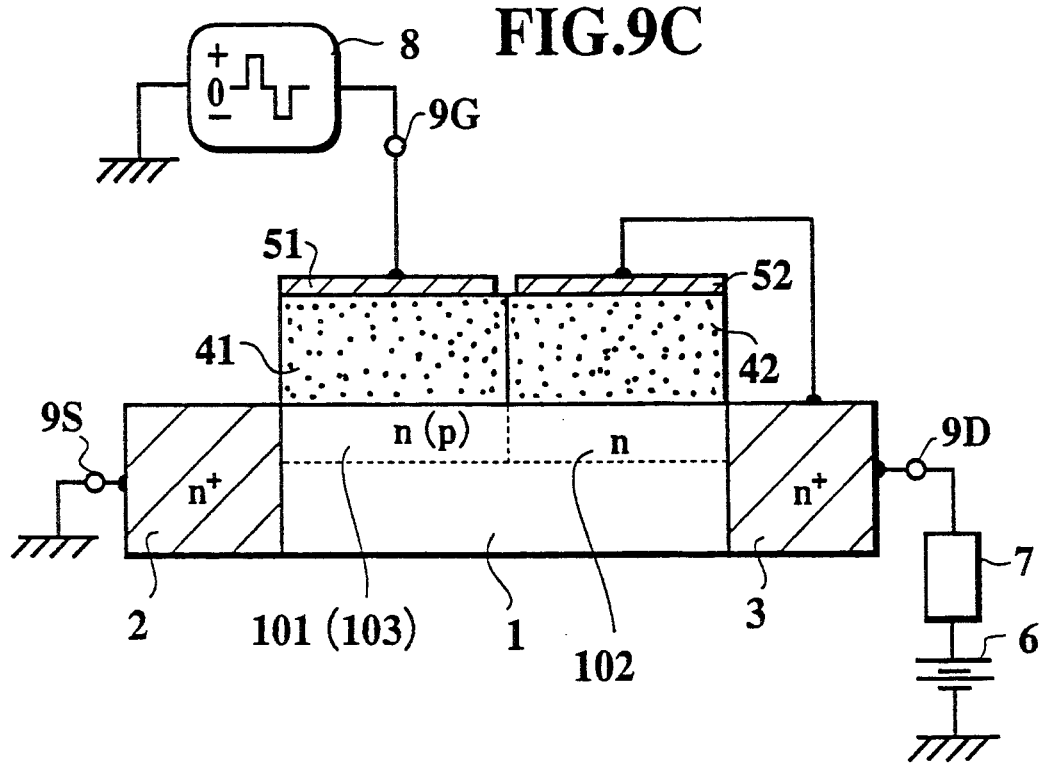

FIG. 9C shows another method, in which the second gate electrode 52 is directly connected to the drain region 3 by a wire to always apply a positive voltage to the second gate electrode 52. This method may be the simplest way of obtaining the three-terminal transistor.

Figure 9D:
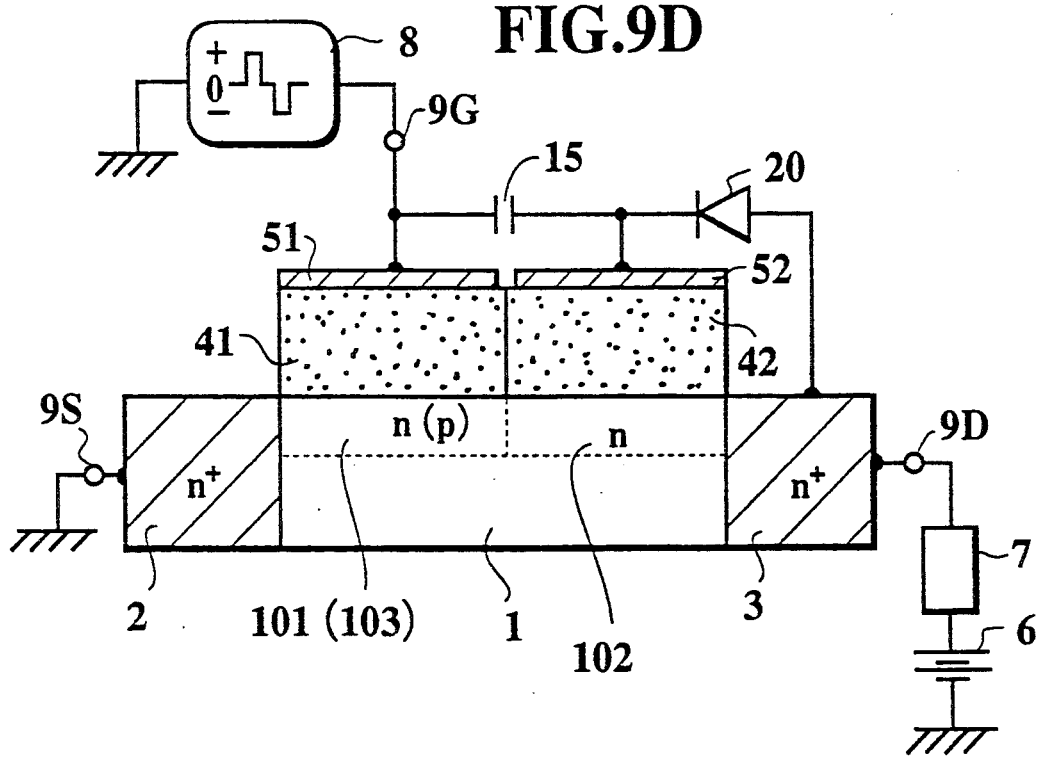

FIG. 9D shows another method, in which the diode 10 shown in FIG. 9B is replaced with a capacitor 15. As far as a high speed switching signal is applied to the first gate electrode 51, it is possible to obtain the similar effect as in the method shown in FIG. 9B.

FIGS. 10A, 10B, 10C and 10D show four similar methods of modifying the third embodiment of the four-terminal thin film transistor shown in FIG. 4 to a three-terminal device.

Figure 10A:
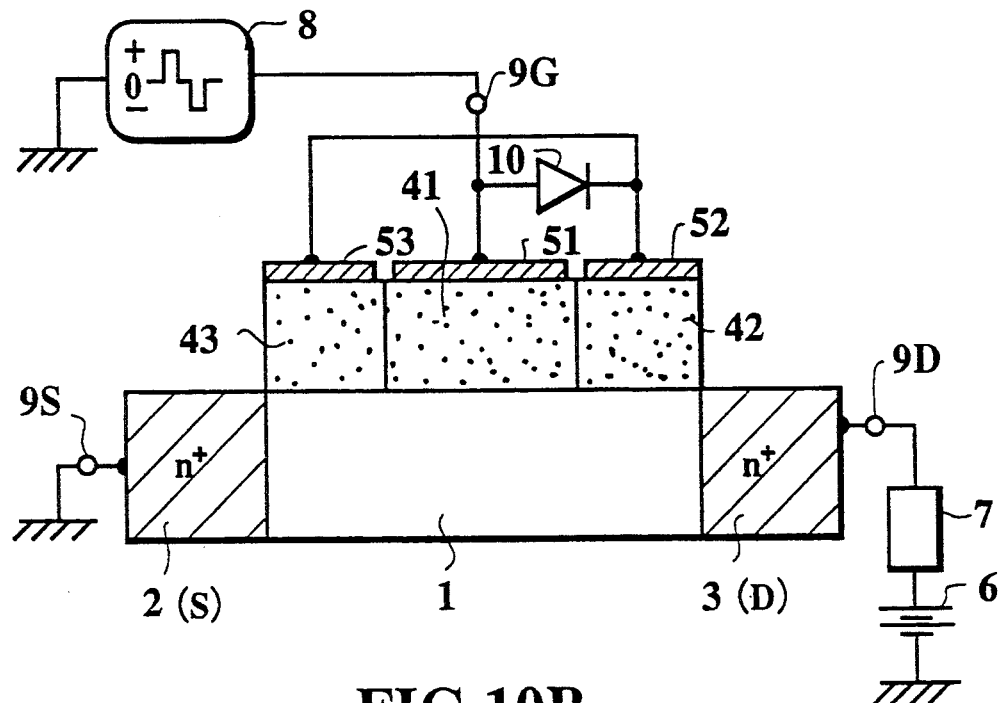

In FIG. 10A, a diode 10 is connected between the first gate electrode 51 and the second and third gate electrodes 52 and 53 in the forward direction from the first gate electrode to second and third gate electrodes. Therefore, when a positive control voltage is applied to all the first, second and third gate electrodes 51, 52 and 53 to turn on the transistor, three n-type channel layers can be formed under the first, second and third gate insulating films 41, 42 and 43, respectively. On the other hand, when a negative control voltage is applied to all the first, second and third gate electrodes 51, 52 and 53 to turn off the transistor, although a p-type channel layer can be formed only under the first gate insulating film 41, since the diode 10 is connected in the backward direction, two p-type channel layers are kept unchanged under the second and third gate insulating film 42 and 43. Therefore, it is possible to form two pn drain junctions in the channel forming region 1 when the transistor is turned off, thus reducing the turn-off leakage current. This method is effective when a high switching frequency pulse signal is applied to the first, second and third gate electrodes 51, 52 and 53. However, in the case of a low switching frequency pulse signal, since the carrier concentration of the channel layers formed under the second and third gate insulating films 42 and 43 inevitably decreases with the lapse of time, this method is not necessarily effective.

Figure 10B:
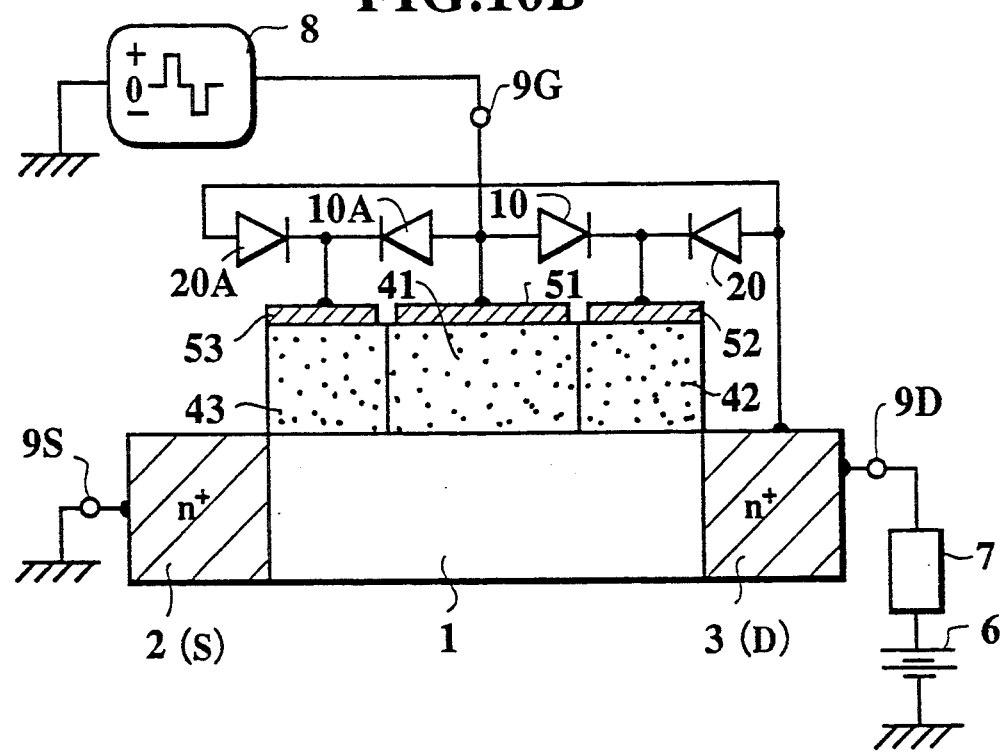

FIG. 10B shows another method, in which another diode 10A is further connected between the first gate electrode 51 and the third gate electrode 53 in the forward direction from the first gate electrode to the third gate electrode 53 and additionally other diodes 20 and 20B are connected between the second and third gate electrodes 52 and 53 and the drain region 3 in the forward direction from the drain region 3 to the second and third gate electrodes 52 and 53. In this method, since the n-type channel layers can be kept formed under the second and third gate insulating films 42 and 43, irrespective of the turn-on or off condition of the transistor, it is possible to more reliably form two pn drain junctions in the channel forming region 1.

Figure 10C:
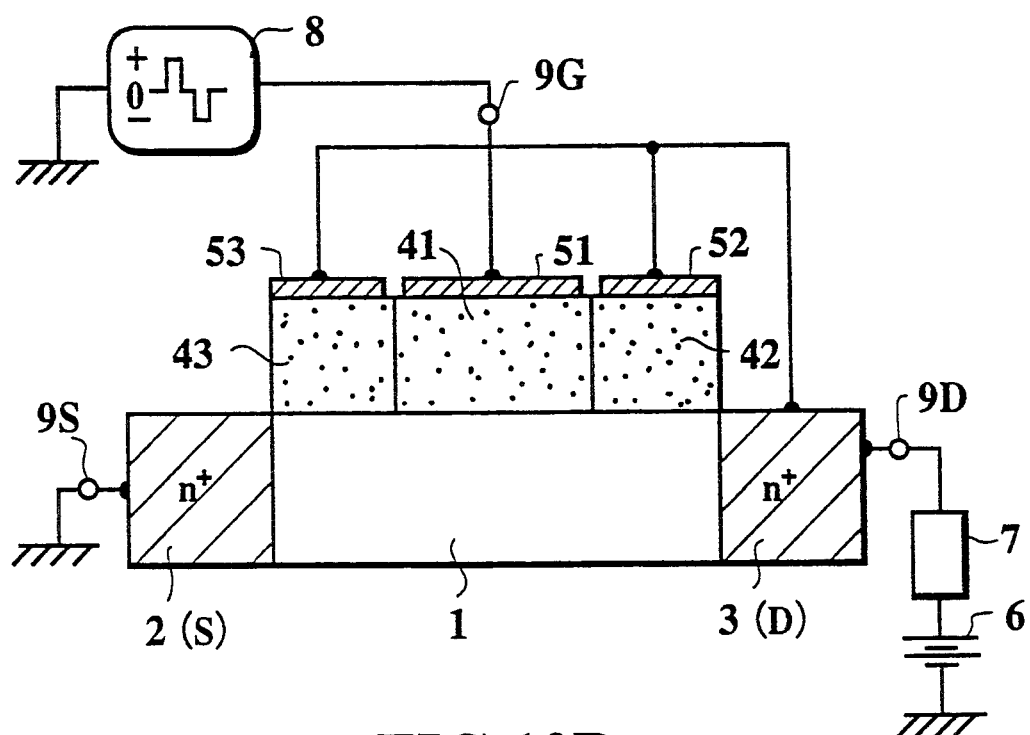

FIG. 10C shows another method, in which the second and third gate electrodes 52 and 53 are directly connected to the drain region 3 by wires to always apply a positive voltage to the second and third gate electrodes 52 and 53. This method may be the simplest way of obtaining the three-terminal transistor; however, since the second and third gate electrodes 52 and 53 are formed at a manufacturing step different from the step of manufacturing the source region 3, it is not necessarily simple to directly connect the second and third gate electrodes 52 and 53 to the drain region 3, from the standpoint of practical manufacturing steps.

Figure 10D:
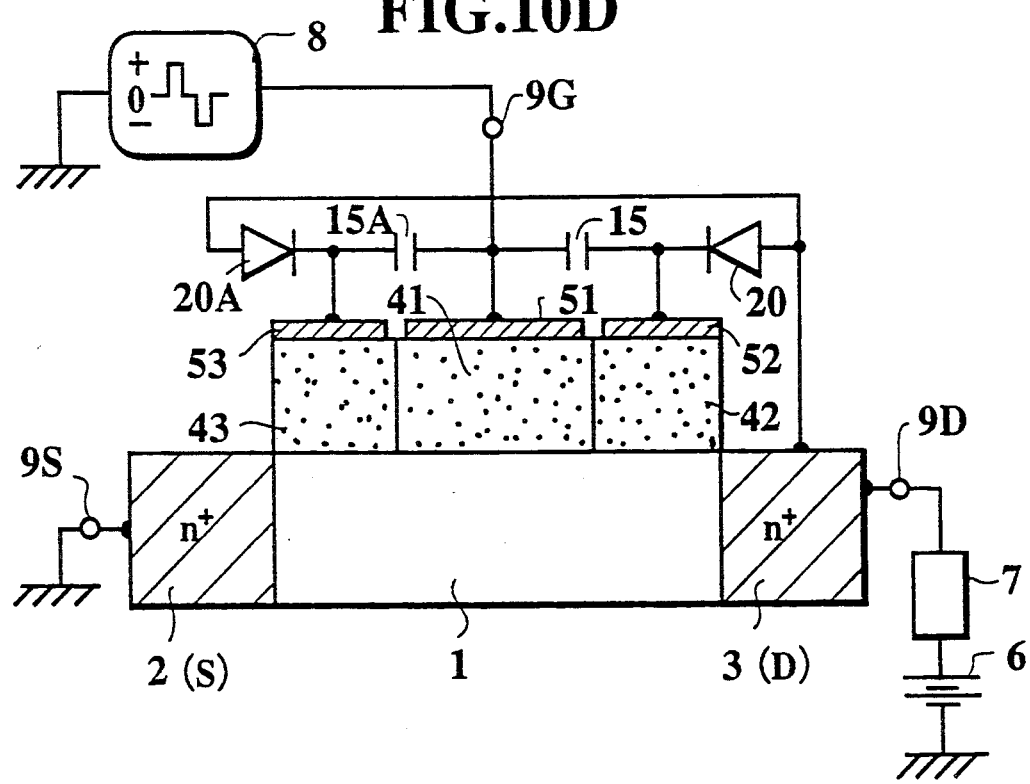

FIG. 10D shows another method, in which the diodes 10 and 10A shown in FIG. 10B are replaced with two capacitors 15 and 15A. As far as a high speed switching signal is applied to the first gate electrode 51, it is possible to obtain the similar effect as in the method shown in FIG. 10B.

Figure 11A:
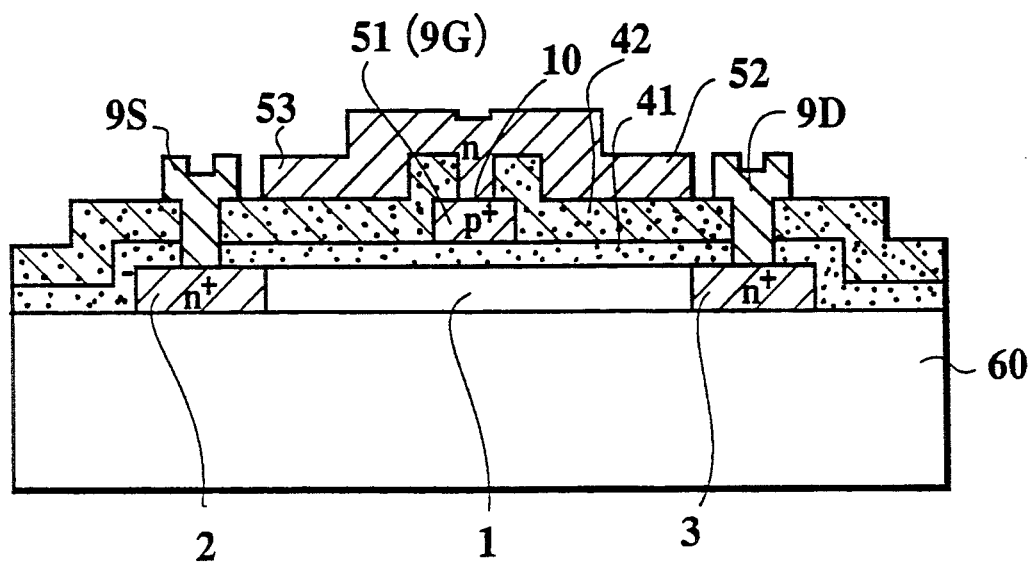
FIGS. 11A, 11B, 11C and 11D are more practical cross-sectional views showing the third embodiment of the three-terminal thin film transistor, in which FIG. 11A corresponds to FIG. 10A.

FIGS. 11A, 11B, 11C and 11D are more practical cross-sectional views showing examples in which the third modifications of the third embodiment shown in FIG. 4C is modified to of the three-terminal thin film transistors as shown in FIGS. 10A, 10B, 10C and 10D, respectively. In FIG. 11A, the transistor is formed on an insulating glass substrate 60; the thickness of the second and third gate insulating films (41+42) is larger than that of the first gate insulating film 41, and further the first gate electrode 51 is formed of a p-type semiconductor layer and the second and third gate electrodes 52 and 53 are formed of an n-type semiconductor layer. Therefore, the diode 10 is formed between the two semiconductor layers 51 and 52, 53.

Figure 11B:
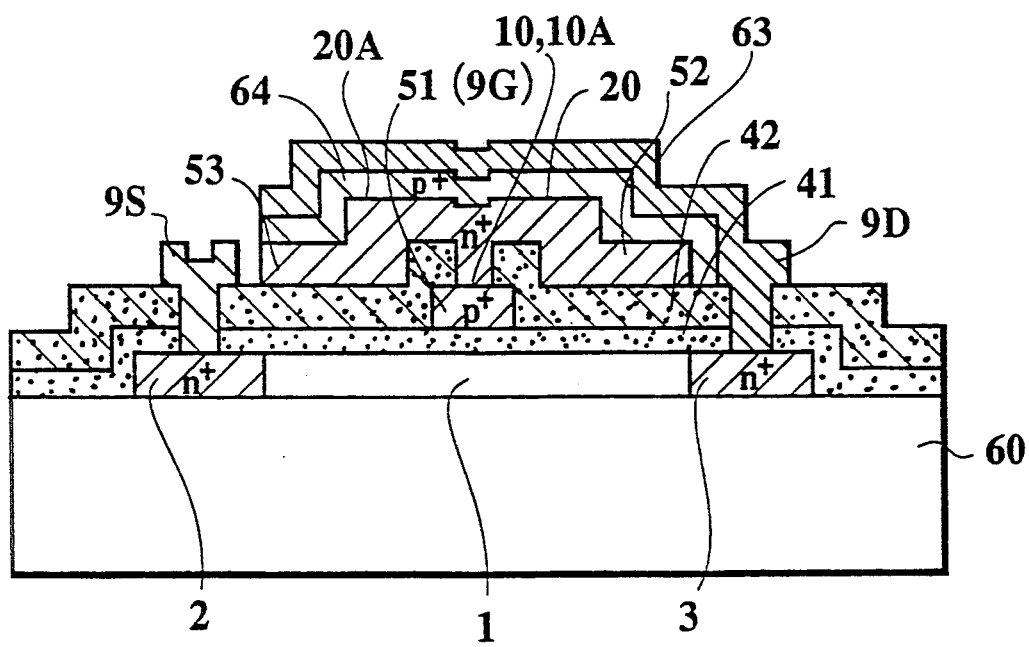

In FIG. 11B, the transistor is formed on an insulating glass substrate 60; the thickness of the second and third gate insulating films (41+42) is larger than that of the first gate insulating film 41; the first gate electrode 51 is formed of a p-type semiconductor layer and the second and third gate electrodes 52 and 53 are formed of an n-type semiconductor layer; and another a p-type semiconductor layer 64 is formed on the second and third gate electrodes 52 and 53 and a conductive layer 63 connected to the drain region 3 is formed on the p-type semiconductor layer 64. Therefore, the two diodes 10 and 10A are formed between the two semiconductor layers 51 and 52, 53, and additionally the two diodes 20 and 20A are formed between the two semiconductor layers 52, 53 and 64.

Figure 11C:
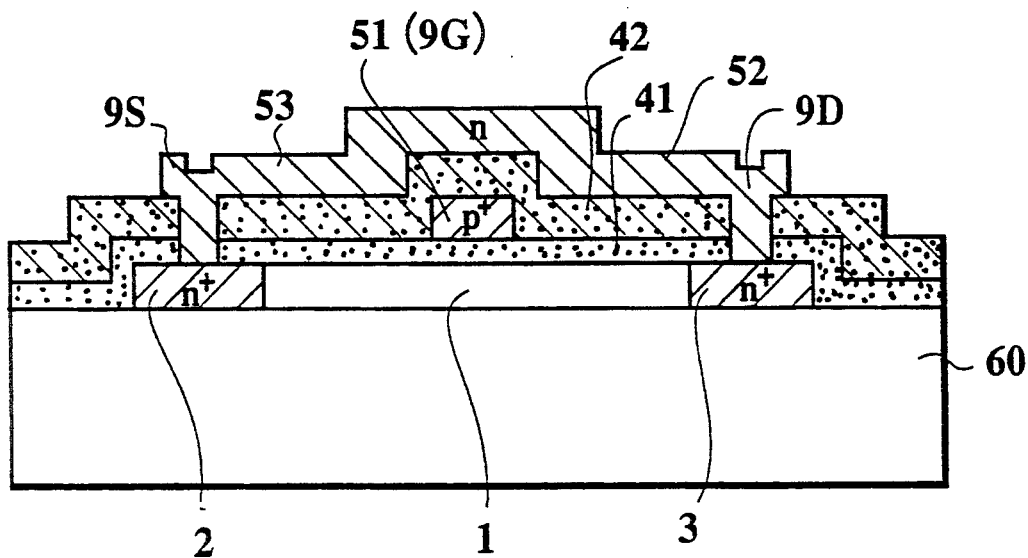

In FIG. 11C, the transistor is formed on an insulating glass substrate 60; the thickness of the second and third gate insulating films (41+42) is larger than that of the first gate insulating film 41; and the drain region 3 is directly connected to the second and third gate electrodes 52 and 53.

Figure 11D:
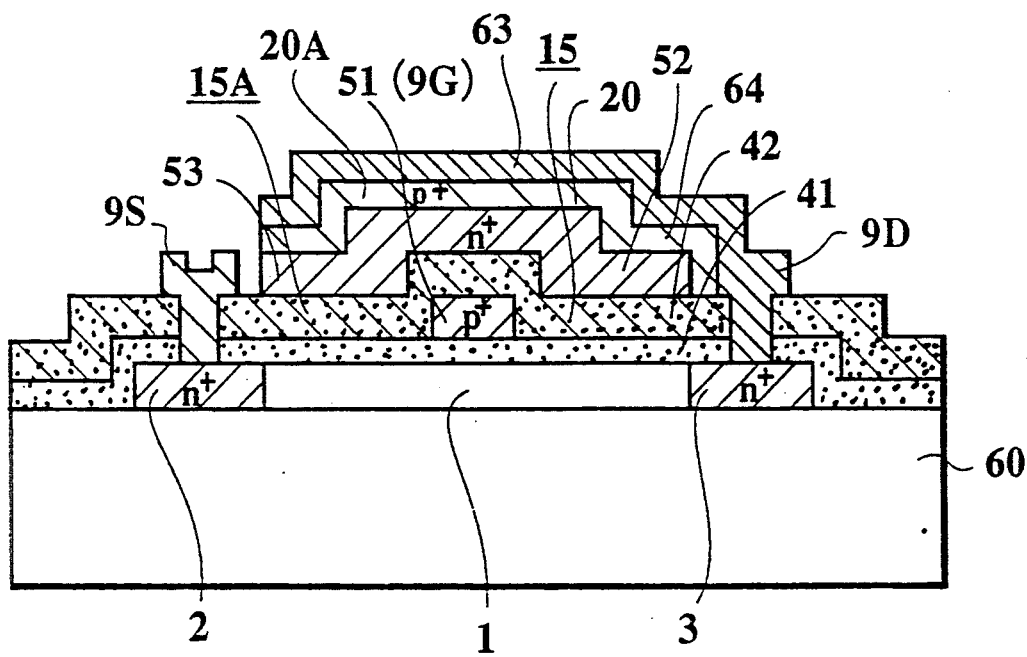

In FIG. 11D, the transistor is formed on an insulating glass substrate 60; the thickness of the second and third gate insulating films (41+42) is larger than that of the first gate insulating film 41; the first gate electrode 51 is formed of a p-type semiconductor layer and the second and third gate electrodes 52 and 53 are formed of an n-type semiconductor layer; and another a p-type semiconductor layer 64 is formed on the second and third gate electrodes 52 and 53 and a conductive layer 63 connected to the drain region 3 is formed on the p-type semiconductor layer 64. Therefore, the two capacitors 15 and 15A are formed between the two semiconductor layers 51 and 52, 53, and additionally the two diodes 20 and 20A are formed between the two semiconductor layers 52, 53 and 64.

A practical application of the thin film transistor according to the present invention to a CMOS (Complementary Metal Oxide Semiconductor) SRAM (Static Random Access Memory) will be described by way of example. The CMOS SRAM is widely used as well as DRAM (Dynamic Random Access Memory), because no reflesh operation is required and the power consumption is small in standby status.

Figure 12:
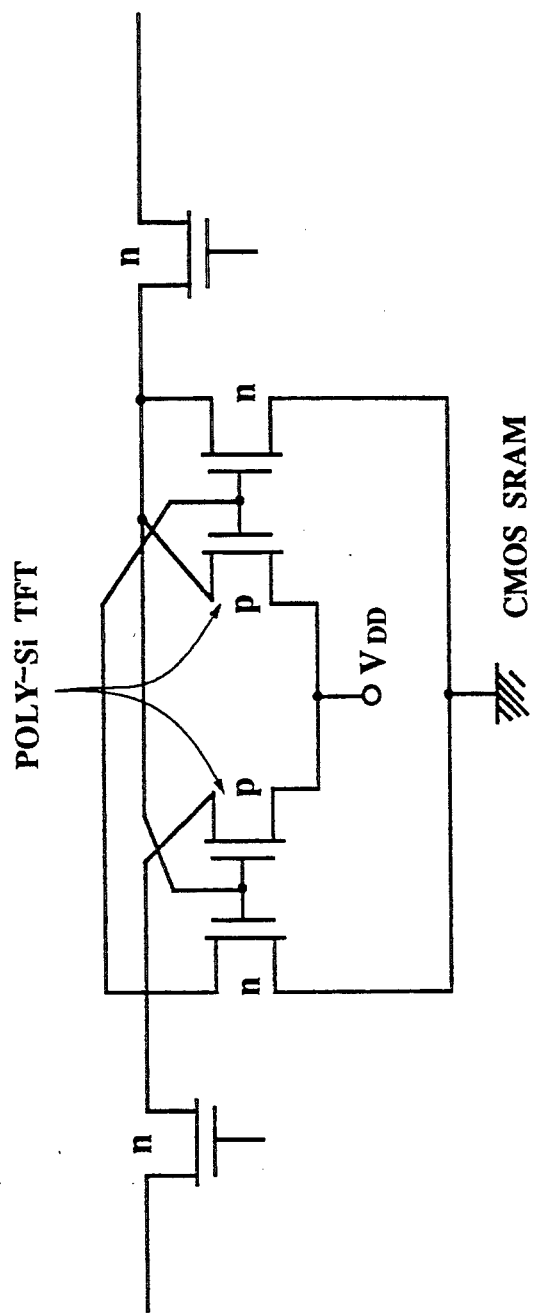
FIG. 12 is a circuit diagram showing a SRAM cell composed of two prior-art stacked CMOSs.
Figure 13A:
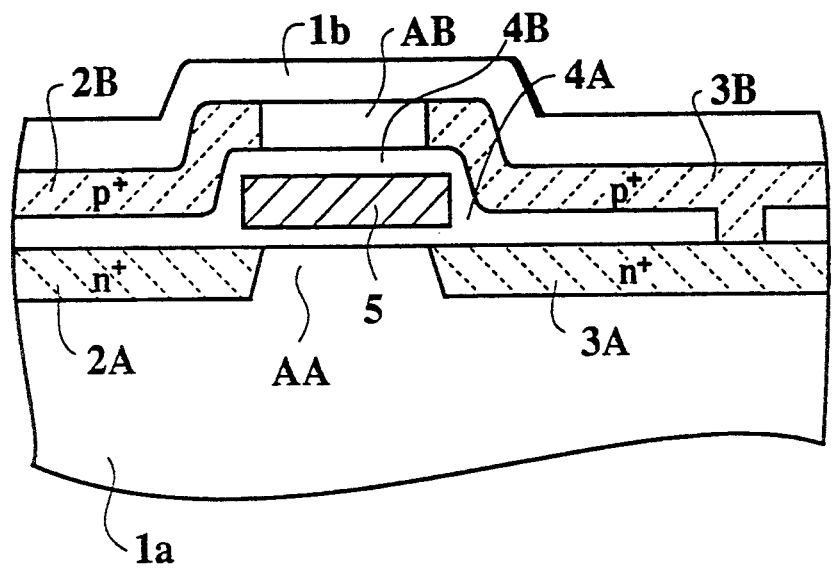
FIG. 13 is a diagrammatical cross-sectional view showing a prior-art stacked CMOS.
FIG. 13B is an equivalent circuit diagram of the prior-art stacked CMOS shown in FIG. 13A.
Figure 13B:
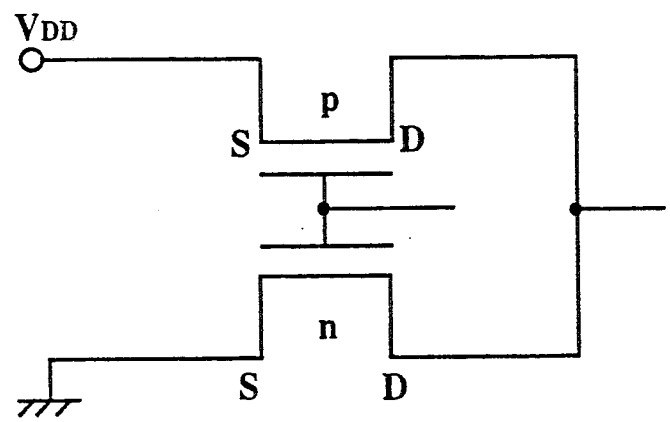

FIG. 12 is a CMOS SRAM cell configured by prior-art thin film transistors. In manufacturing the CMOS SRAM, conventionally p-MOSFET and n-MOSFET are formed on a plane and connected to each other simply via an A film pattern. To reduce the memory area of the CMOS SRAM, recently a stacked CMOS structure has been proposed, in which the CMOS can be formed by stacking polysilicon thin film transistors into three-dimensional form as shown in FIG. 13A. FIG. 13B is an equivalent circuit diagram corresponding to the stacked CMOS shown in FIG. 13A.

In FIG. 13A, the n-MOSFET is composed of $n^+$-type silicon source and drain electrode layers 2A and 3A formed on a plane of a p-type single crystal silicon substrate 1a so as to form an active (channel forming) region AA in the silicon substrate 1a and between the source and drain electrodes 2A and 2B, a polysilicon common gate electrode 5 formed on the active region AA, and a silicon oxide gate insulating film 4A formed around the gate electrode 5 and on the active layer AA. Further, the p-MOSFET (thin film transistor) stacked on the n-MOSFET is composed of $p^+$-type polysilicon source and drain electrode layers 2B and 3B formed on the silicon oxide gate insulating film 4B so as to form another polysilicon active layer AB between the source and drain electrodes 2B and 3B and on the common gate electrode 5, and a protective insulating film 1b formed on the source and drain electrodes 2B and 3B. Further, polysilicon gate electrode 5 is used in common for both the n- and p-MOSFETs. The CMOS SRAM shown in FIG. 12 can be formed by connecting these two CMOS-FETs shown in FIG. 13.

In the CMOS SRAM shown in FIGS. 13A and 13B, although the driving capability is sufficient, since the off current is relatively large, there exists a problem in that the power consumption of the prior-art SRAM is relatively high in the standby status.

Figure 14A:
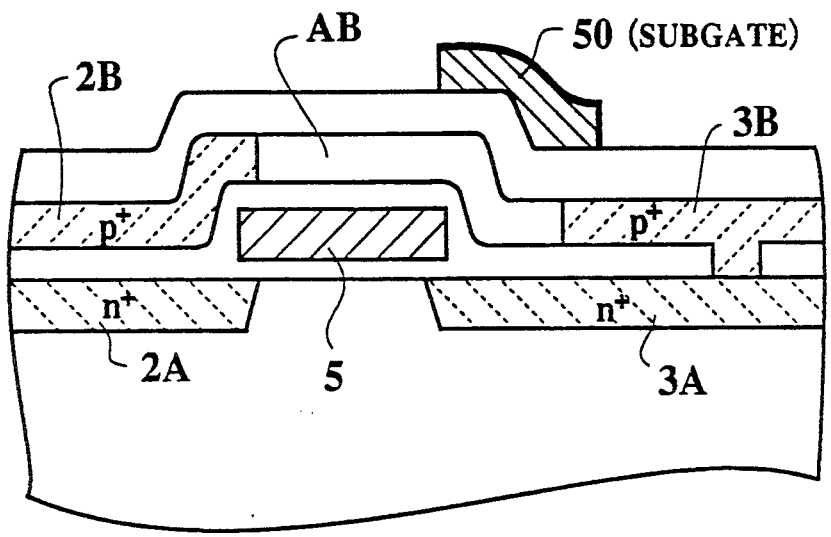
FIG. 14A is a diagrammatical cross-sectional view showing a first embodiment of the stacked CMOS composed of thin film transistors according to the present invention and MOSFET.
Figure 14B:
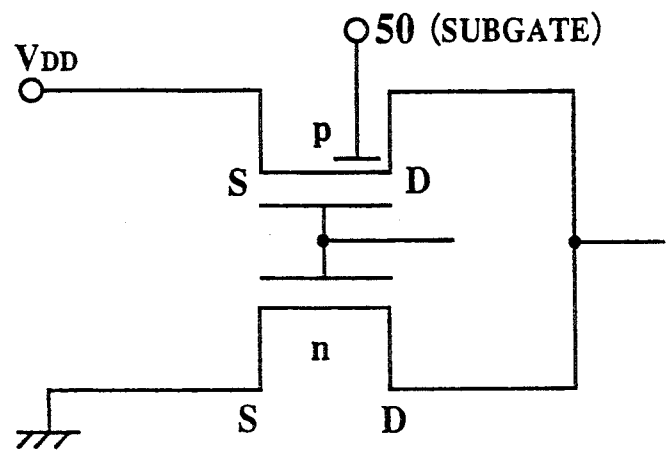
FIG. 14B is an equivalent circuit diagram of the stacked CMOS shown in FIG. 14A.

FIG. 14A shows a cross-sectional view of a stacked CMOS formed by the polysilicon thin film transistor according to the present invention as p-MOSFET, and FIG. 14B is an equivalent circuit diagram corresponding to the stacked CMOS shown in FIG. 14A.

The points different from the prior-art structure shown in FIG. 13A are that the drain electrode 3B of the p-MOSFET has a little offset away from the common gate electrode 5, and an additional subgate electrode 50 is formed on the offset active polysilicon layer AB by use of an A/ film pattern, for instance.

In this stacked CMOSFETs, when a negative voltage is applied to the subgate 50, since a $p^+$-type layer can be induced at the active layer AB formed just under the subgate 50, this subgate 50 serves effectively as $p^+$-type drain electrode, so that it is possible to markedly reduce the p-MOSFET (thin film transistor) off current of the resulting in standby-power reduction of CMOSFET shown in FIGS. 14A and 14B.

Figure 15A:
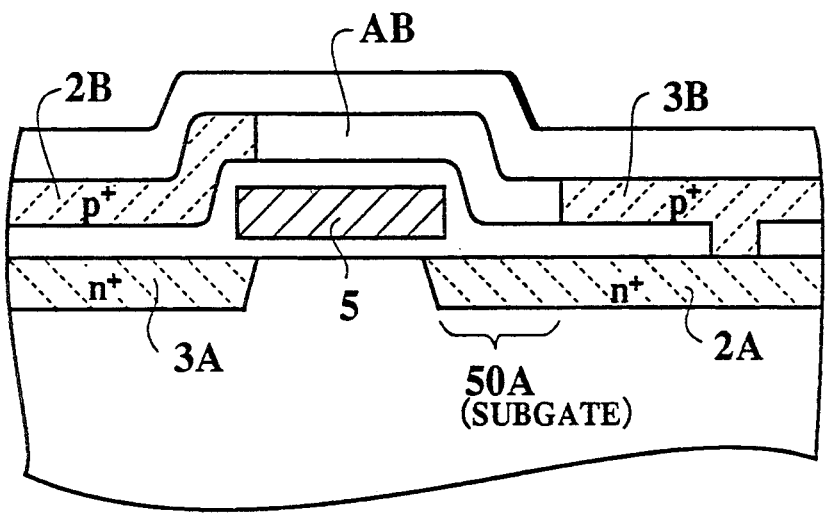
FIG. 15A is a diagrammatical cross-sectional view showing a second embodiment of the stacked CMOS composed of thin film transistors according to the present invention and MOSFET.
Figure 15B:
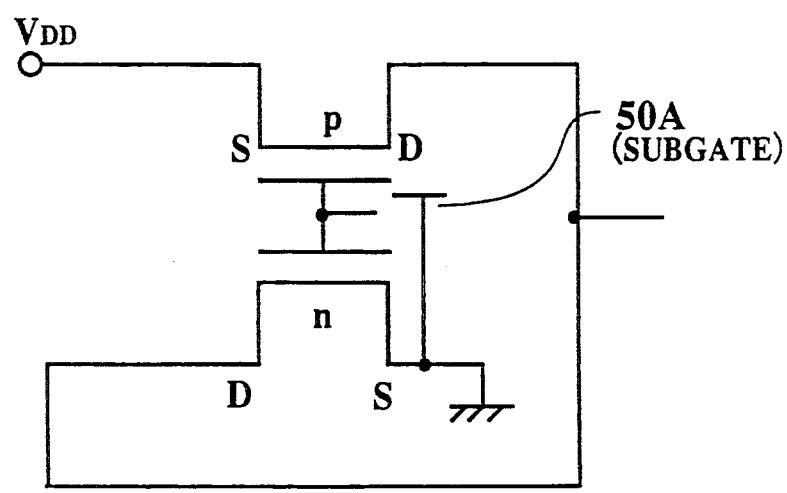
FIG. 15B is an equivalent circuit diagram of the stacked CMOS shown in FIG. 15A.

FIG. 15A shows a cross-sectional view of another example of stacked CMOSs formed by polysilicon thin film transistor according to the present invention as p-MOSFET, and FIG. 15B is an equivalent circuit diagram corresponding to the stacked CMOS shown in FIG. 15A.

The points different from the prior-art structure shown in FIG. 13A are that the drain electrode 3B of the p-MOSFET is a little offset away from the common gate electrode 5, and part of the source electrode 2A of the n-MOSFET is used in common as a subgate 50A formed under the offset active polysilicon layer AB.

In this stacked CMOSFETs, when a zero voltage is applied to the subgate 50A, since a $p^+$layer can be induced at the active layer AB formed just above the subgate 50A, this subgate 50A serves effectively as a $p^+$-type drain electrode, so that it is possible to markedly reduce the off current of the CMOSFETs shown in FIGS. 15A and 15B.

Figure 16A:
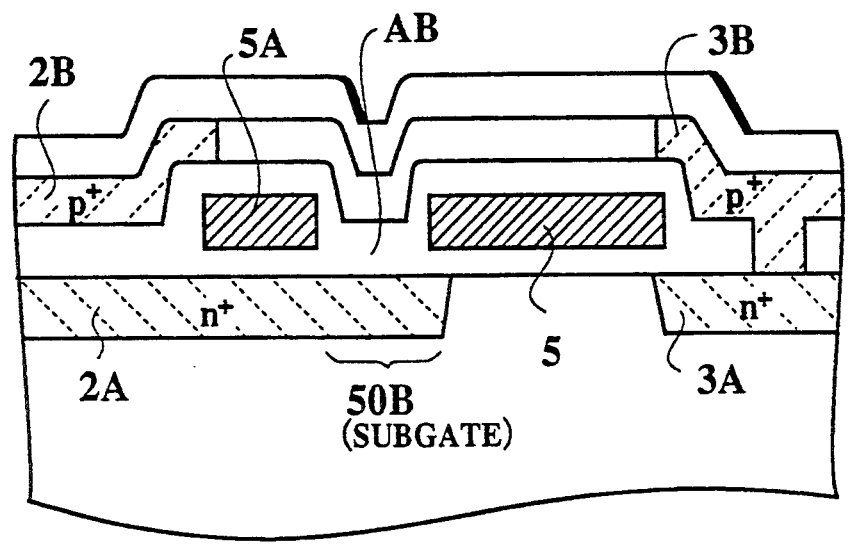
FIG. 16A is a diagrammatical cross-sectional view showing a third embodiment of the stacked CMOS composed of thin film transistor according to the present invention and MOSFET.
Figure 16B:
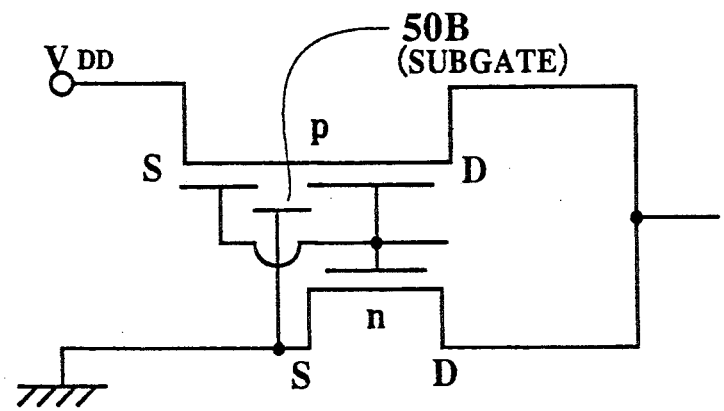
FIG. 16B is equivalent circuit diagram of the stacked CMOS shown in FIG. 16A.

FIG. 16A shows a cross-sectional view of another example of stacked CMOSs formed by two polysilicon thin film transistors according to the present invention, and FIG. 16B is an equivalent circuit diagram corresponding to the stacked CMOS shown in FIG. 16A.

The points different from the prior-art structure shown in FIG. 13A are that another gate 5A for the p-MOSFET is formed near the common electrode 5; and part of the source electrode 2A of the n-MOSFET is used in common as a subgate 50B formed under the middle active polysilicone layer AB between the two gate electrodes 5 and 5A.

In this stacked CMOSFETs, when a zero or negative voltage is applied to the subgate 50B, since a p+layer can be induced at the middle active layer AB formed just above the subgate 50B, this subgate 50B serves effectively as an additional p+-type drain electrode, so that it is possible to markedly reduce the off current of the CMOSFETs shown in FIGS. 16A and 16B.

As described in the SRAM formed by two stacked CMOSs composed of the p-MOSFETs according to the present invention, since it is possible to markedly reduce the off current, the power consumption can be improved when the SRAM is kept in the standby condition.

The practical effects of the thin film transistor according to the present invention will be described with reference to the attached drawings.

Figure 17:
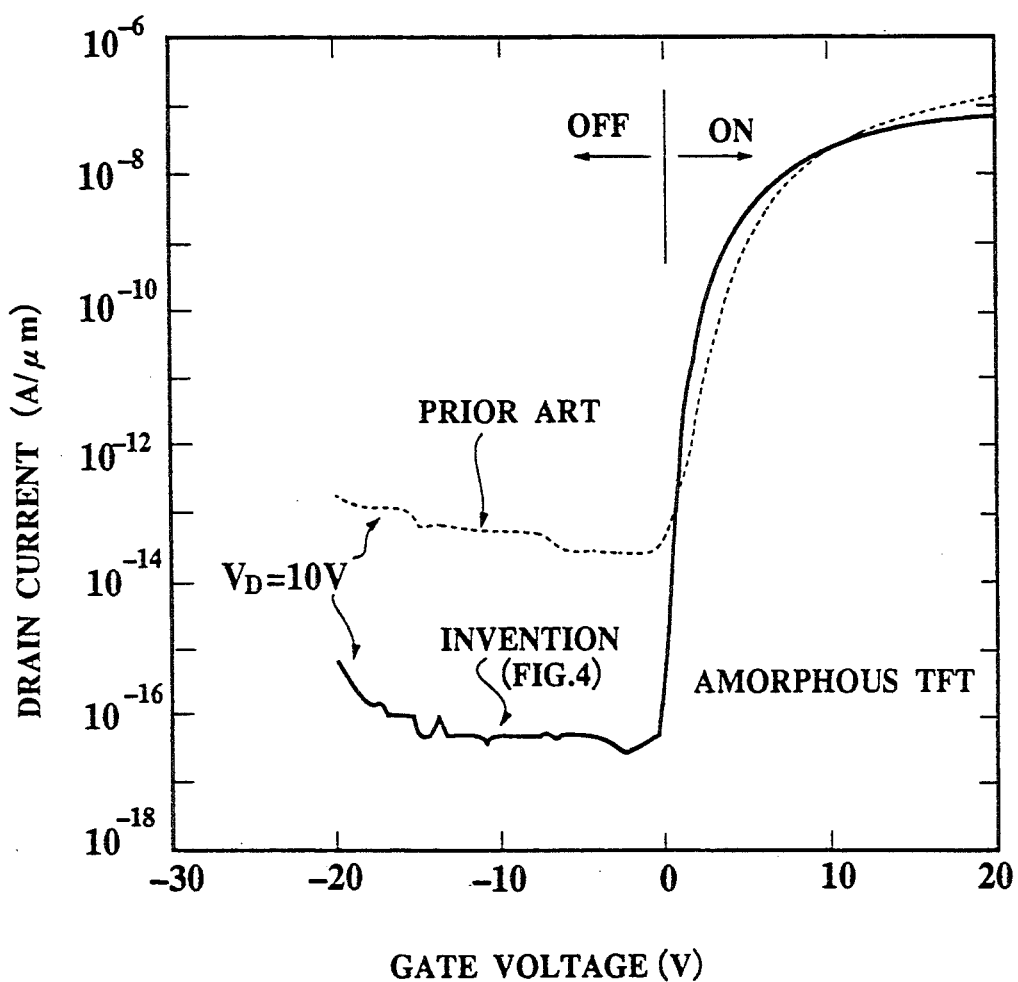
FIG. 17 is a graphical representation showing the characteristics between the gate voltage and the drain current at the drain voltage of 10 V, in which the dashed line indicates the prior-art amorphous silicon transistor and the solid line indicates the amorphous silicon transistor of the present invention.

FIG. 17 shows the drain current gate voltage characteristics with the drain voltage kept at 10 V, in which the solid line shows the characteristics of the thin film transistor of the third embodiment (shown in FIG. 4 and an amorphous silicon film is used as the channel forming film) according to the present invention and the dashed line shows those of the prior-art amorphous silicon thin film transistor as shown in FIG. 1A.

FIG. 17 indicates that the on current is almost the same in both, however, the off current of the amorphous silicon thin film transistor according to the present invention is as small as about 1/1000 or less as compared with that of the prior-art amorphous silicon thin film transistor.

Figure 18A:
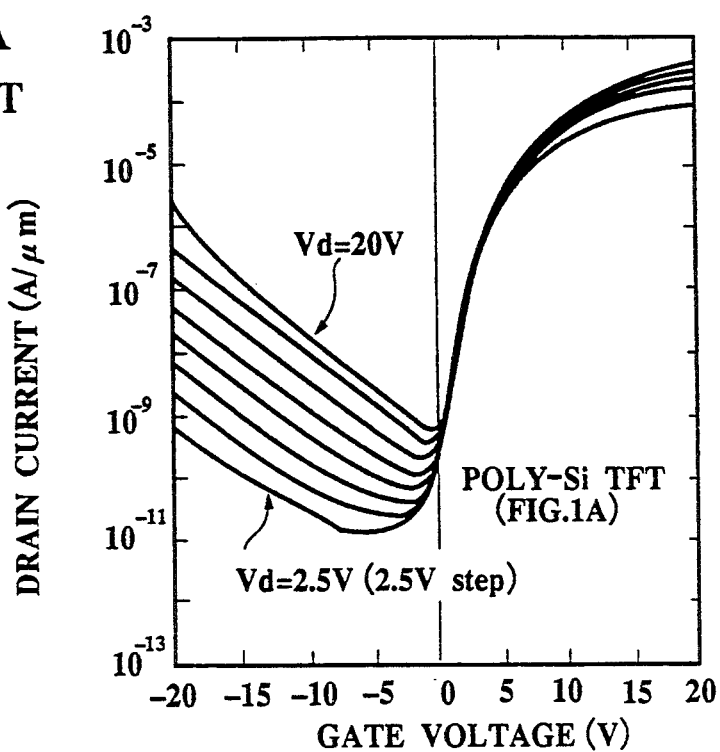
FIG. 18A is a graphical representation showing the same gate voltage-drain current characteristics at different drain voltages of the prior-art polysilicon thin film transistor shown in FIG. 1A.

FIG. 18A shows the drain current—gate voltage characteristics with the drain voltage changed as parameter from 2.5 V to 20 V at a step of 2.5 V, for the prior-art polysilicon thin film transistor as shown in FIG. 1A.

Figure 18B:
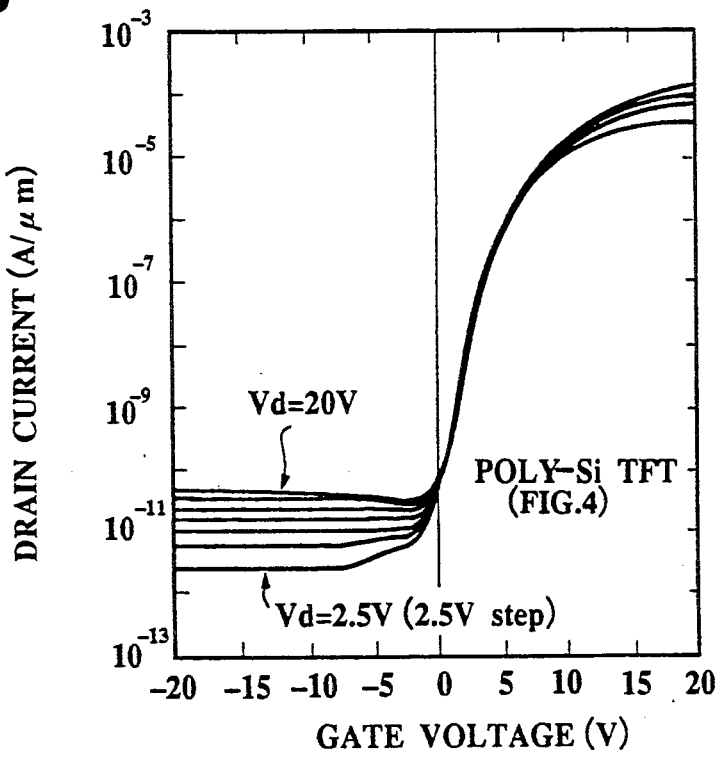
FIG. 18B is a graphical representation showing the same gate voltage-drain current characteristics at different drain voltages of the polysilicon thin film transistor of the present invention shown in FIG. 4-3.

FIG. 18B shows the similar drain current—gate voltage characteristics with the drain voltage changed as parameter from 2.5 V to 20 V at a step of 2.5 V, for the thin film transistor of the third embodiment (shown in FIG. 4 and a polysilicon film is used as the channel forming film) according to the present invention. These graphs indicate that in the case of the prior-art polysilicon transistor, off current is high and further sharply increases with increasing negative gate voltage and with increasing positive drain voltage Vd. In contrast, the off current of the polysilicon thin film transistor according to the present invention is as small as about 1/1000 or less at a gate voltage of −20 V and a drain voltage of 20 V. Additionally, it is possible to prevent the off current from being increased sharply with increasing positive drain voltage.

Figure 18C:
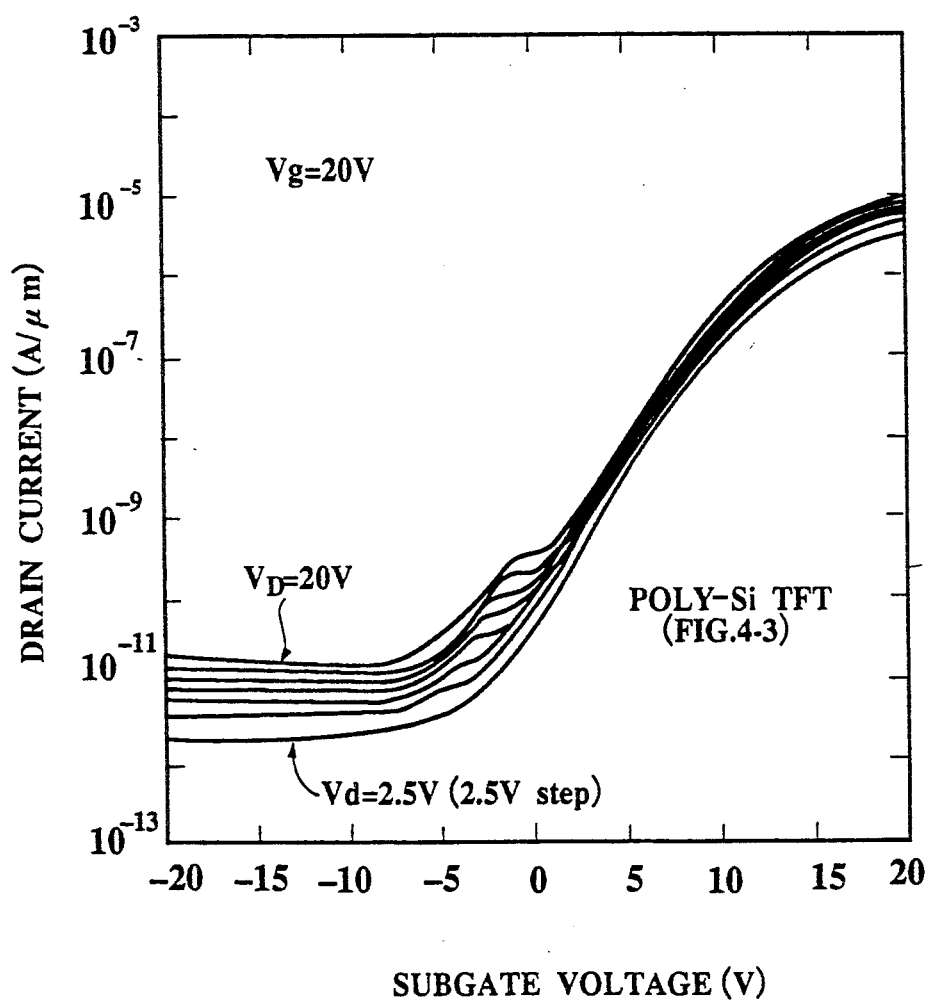
FIG. 18C is a graphical representation showing the same gate voltage-drain current characteristics at different drain voltages of the thin film transistor of the present invention shown in FIG. 4-3, in which the first gate electrode is replaced with the second gate electrode.

FIG. 18C shows the drain current—subgate voltage characteristics with the drain voltage changed as parameter from 2.5 V to 20 V at a step of 2.5 V, for the thin film transistor of the third embodiment (shown in FIG. 4C and a polisilicon film is used as the channel forming film) according to the present invention, in which the first gate electrode 51 is replaced with the second and third gate electrodes 52 and 53. That is, in the case of FIG. 18C, a positive voltage is applied to the first (main) gate electrode 51 and a negative voltage is applied to the second and third (sub-) gate electrodes 52 and 53 to turn off the transistor. FIG. 18C also indicates that it is possible to markedly reduce the off current.

In the above embodiments, n-p-n type transistors have mainly been described by way of example. Without being limited thereto, it is of course possible to apply the present invention to p-n-p type transistor. In this case, the n-type layer or region is replaced with the p-type layer or region or vice versa.

As described above, in the thin film transistor according to the present invention, since at least one subgate is provided in addition to the main gate, in order to form (1) at least one pn drain junction induced by two opposite-polality electric fields in the channel forming region between the source and drain regions by applying a first voltage to the main gate and a second voltage opposite to the first voltage to the subgate or (2) at least thick depletion layers induced by two same-polarity different— intensity electric fields between the channel forming region and the source or drain region whenever the transistor is turned off, it is possible to markedly reduce the off current flowing between the source and drain regions in particular when a higher voltage is applied to the drain voltage and a higher negative voltage is applied to the main gate, without reducing the on current, thus markedly increasing the on/off current ratio of the thin film transistor.

Further, since it is possible to simply modify the four-terminal thin film transistor including at least one subgates according to the present invention to the three-terminal device by additionally forming at least one diode, capacitor or conductive layer when the transistor is being formed, the thin film transistor can be used as in the same way as the ordinary three-terminal transistors.

Furthermore, since the thin film transistor can be formed in accordance with the ordinary transistor manufacturing process, without need of any special manufacturing steps, it is possible to improve the production yield and therefore manufacture the thin film transistor at low cost.

What is claimed is:

1. A thin film transistor formed in a thin film semiconductor substrate, comprising:
   (a) a source region formed of a first conductive type semiconductor film at a first end of the semiconductor substrate;
   (b) a drain region formed of the same first conductive type semiconductor film at a second end of the semiconductor substrate;
   (c) a channel forming region formed of the thin film semiconductor substrate having a low impurity concentration between said source and drain regions;
   (d) a first gate formed over a first principal plane of said channel forming region via a first gate insulating film;
   (e) a second gate formed over said channel forming region via a second gate insulating film;
   (f) a first voltage supply for supplying voltage to said first gate; and
   (g) a second voltage supply voltage to said second gate; and wherein said first and second voltage supplies apply a first polarity voltage to said first and second gates to from first conductive type channel layers in said channel forming region under said first and second gate insulating film when the transistor is turned on, but said first voltage supply applies a second polarity voltage opposite to the first polarity to said first gate to form a second conductive type channel layer in said channel forming region only under said first gate insulating film and said second voltage supply applies the first polarity voltage to said second gate to maintain the first conductive type channel layer in said channel forming region under said second gate insulating film when the transistor is turned off, so that a pn junction can be formed in said channel forming region under between said first and second gate insulating films to reduce of current flowing between said source and drain regions.

2. The thin film transistor of claim 1, wherein said first gate and said second gate are formed on a first principal plane of said channel forming region.

3. The thin film transistor of claim 1, wherein said first gate is formed on a first principal plane of said channel forming region and said second gate is formed on a second principal plane opposite to the first principal plane of said channel forming region.

4. The thin film transistor of claim 1, which further comprises a third gate formed over said channel forming region via a third gate insulating film so as to sandwich the first gate between said second and third gates and wherein said first gate and said second and third gates are all formed on a first principal plane of said channel forming region.

5. The thin film transistor of claim 1, which further comprises a third gate formed over said channel forming region via a third gate insulating film so as to sandwich the first gate between said second and third gates and wherein said first gate is formed on a first principal plane of said channel forming region and said second and third gates are formed on a second principal plane opposite to the first principal plane of said channel forming region.

6. The thin film transistor of claim 1, wherein thickness of said second gate insulating film is smaller than that of said first gate insulating film.

7. The thin film transistor of claim 1, wherein dielectric constant of said second gate insulating film is larger than that of said first gate insulating film.

8. The thin film transistor of claim 1, wherein fixed charge of said second gate insulating film is larger than that of said first gate insulating film.

9. The thin film transistor of claim 2, wherein said second gate is connected to said first gate via a diode in the backward direction from said second gate to said first gate.

10. The thin film transistor of claim 2, wherein said second gate is connected to said first gate via a first diode in the backward direction from said second gate to said first gate and further connected to said drain region via a second diode in the backward direction from said second gate to said drain region.

11. The thin film transistor of claim 2, wherein said second gate is connected to said drain region via a conductive layer.

12. The thin film transistor of claim 2, wherein said second gate is connected to said first gate via a capacitor and further connected to said drain region via a diode in the backward direction from said second gate to said drain region.

13. The thin film transistor of claim 3, wherein said second gate is connected to said first gate via a diode in the backward direction from said second gate to said first gate.

14. The this film transistor of claim 3, wherein said second gate is connected to said first gate via a first diode in the backward direction from said second gate to said first gate and further connected to said drain region via a second diode in the backward direction from said second gate to said drain region.

15. The thin film transistor of claim 3, wherein said second gate is connected to said drain region via a conductive layer.

16. The thin film transistor of claim 3, wherein said second gate is connected to said first gate via a capacitor and further connected to said drain region via a diode in the backward direction from said second gate to said drain region.

17. The thin film transistor of claim 4, wherein said second and third gates are connected to said first gate via a diode in the backward direction from said second and third gates to said first gate.

18. The thin film transistor of claim 4, wherein said second and third gates are connected to said first gate via two diodes, respectively in the backward direction from said second and third gates to said first gate and further connected to said drain region via two different diodes in the backward direction from said second and third gates to said drain region.

19. The thin film transistor of claim 4, wherein said second and third gates are connected to said drain region via conductive layers.

20. The thin film transistor of claim 4, wherein said second and third gates are connected to said first gate via two capacitors, respectively and further connected to said drain region via two diodes, respectively in the backward direction from said second and third gates to said drain region.

21. The thin film transistor of claim 5, wherein and third gates are connected to said first gate via a diode in the backyard direction from said second and third gates to said first gate.

22. The thin film transistor of claim 5, wherein said second and third gates are connected to said first gate via two diodes, respectively in the backward direction from said second and third gates to said first gate and further connected to said drain region via two different diodes in the backward direction from said second and third gates to said drain region.

23. The thin film transistor of claim 5, wherein said and third gates are connected to said drain region via conductive layers.

24. The thin film transistor of claim 5, wherein said second and third gates are connected to said first gate via two capacitors, respectively and further connected to said drain region via two diodes, respectively in the backward direction from said second and third gates to said drain region.

* * * * *